United States Patent
Nitzan et al.

(10) Patent No.: US 12,176,044 B1
(45) Date of Patent: Dec. 24, 2024

(54) BIT ERROR RATE ESTIMATION AND CLASSIFICATION IN NAND FLASH MEMORY

(71) Applicant: Kioxia Corporation, Tokyo (JP)

(72) Inventors: Eyal Nitzan, Haifa (IL); Avi Steiner, Haifa (IL); Hanan Weingarten, Haifa (IL); Yasuhiko Kurosawa, Yokohama (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 18/123,232

(22) Filed: Mar. 17, 2023

(51) Int. Cl.
*G11C 16/34* (2006.01)
*H03M 13/01* (2006.01)
*H03M 13/11* (2006.01)
*H03M 13/43* (2006.01)

(52) U.S. Cl.
CPC ....... *G11C 16/3431* (2013.01); *H03M 13/015* (2013.01); *H03M 13/1108* (2013.01); *H03M 13/43* (2013.01)

(58) Field of Classification Search
CPC .................................................. G11C 16/3431
See application file for complete search history.

(56) References Cited

U.S. PATENT DOCUMENTS

| 8,751,726 | B2 | 6/2014 | Katz | |
| 9,524,790 | B1* | 12/2016 | Steiner | G11C 16/16 |
| 9,672,940 | B1* | 6/2017 | Reusswig | G11C 11/5628 |
| 11,195,585 | B2 | 12/2021 | Tokutomi et al. | |
| 2013/0166972 | A1* | 6/2013 | Seabury | G06F 11/1048 714/708 |
| 2014/0258796 | A1* | 9/2014 | Ghaly | G11C 7/14 714/708 |
| 2016/0218740 | A1* | 7/2016 | Parthasarathy | G11C 29/00 |
| 2019/0108090 | A1* | 4/2019 | Shen | G11C 11/5628 |
| 2019/0156896 | A1* | 5/2019 | Park | G11C 16/0483 |
| 2020/0183771 | A1* | 6/2020 | Liikanen | G06F 11/076 |
| 2020/0250028 | A1* | 8/2020 | Vittal Prabhu | G06F 11/076 |
| 2021/0383886 | A1* | 12/2021 | Alrod | G11C 29/42 |

* cited by examiner

*Primary Examiner* — Joseph D Torres
(74) *Attorney, Agent, or Firm* — Foley & Lardner LLP

(57) ABSTRACT

A method for reading data from an SSD, comprising: retrieving data from a target row of memory cells using initial threshold voltages; decoding the data using a first hard decision decoding stage; estimating a bit error rate (BER) of a target row of memory cells based on a distribution of threshold voltages of cells in a memory block containing the target row when the first hard decision decoding stage fails; classifying the BER of the target row based on a first BER threshold (BER-TH1); and executing a first read flow comprising at least one hard decision decoding stage if the BER is less than the BER-TH1, and executing a second read flow similar to the first read flow if the BER is greater than or equal to the BER-TH1, the second read flow skipping a hard decision decoding stage of the first read flow.

23 Claims, 11 Drawing Sheets

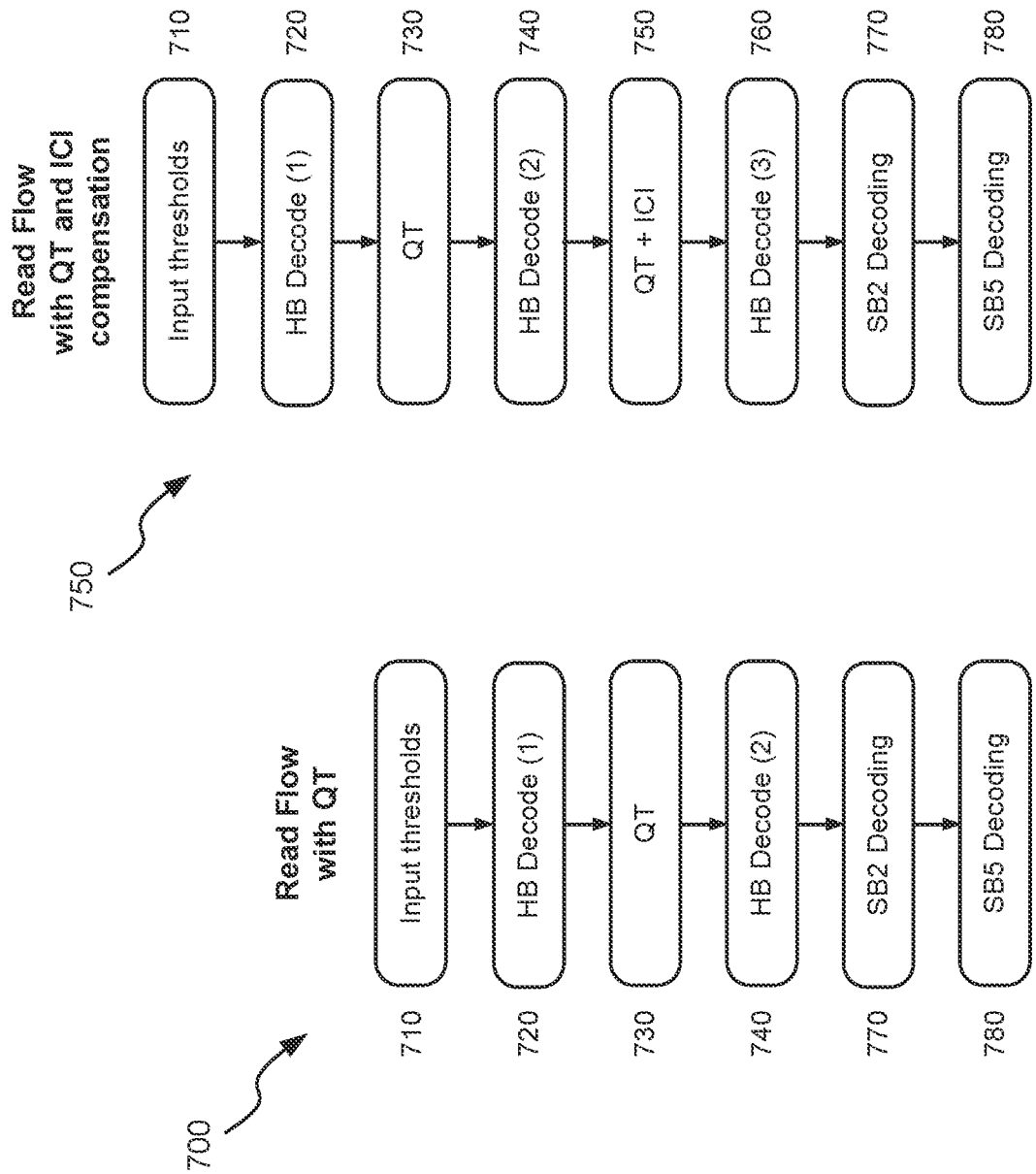

BIT ERROR RATE ESTIMATION AND CLASSIFICATION IN NAND FLASH MEMORY

FIELD

The present disclosure relates to solid-state drives (SSD) and methods for optimizing read flow based on the estimation and classification of the bit error rate (BER) of the memory cells to reduce latency and improve quality of service (QoS).

BACKGROUND

A solid-state drive (SSD) generally has faster performance, is more compact, and is less sensitive to vibration or physical shock than a magnetic disk drive. Given these advantages, SSDs are being used in more and more computing devices and other consumer products in lieu of or in addition to magnetic disk drives, even though the cost-per-gigabyte storage capacity of SSDs is significantly higher than that of magnetic disk drives. SSDs utilize physical memory cells that comprise non-volatile semiconductor storage devices, such as NAND memory devices, to store data. A controller of an SSD manages the transfer of data between a host and the memory cells of the SSD. Writing data to and reading data from the physical memory cells of an SSD typically involves transferring data between a host external to the SSD and the nonvolatile semiconductor storage devices.

SSDs are subject to large volumes of data traffic as they receive multiple read and write requests from the host. The wear and tear of the device results in an increase in error rates of data decoded from such memories. Accordingly, there has been an increase in emphasis on improving the error correction capability provided by NAND flash memory controllers. Error correction is beneficial where reliability and endurance problems increase as flash memory density increases.

A flash memory is generally organized in units of pages. A page may be the smallest unit that is individually programmable. A block, which may be the smallest unit which can be erased, is composed of multiple pages. A page of memory is provided with a spare area, which is used for the extra bits for error-correcting code (ECC), as well as other functions such as bits for keeping track of wear leveling and other metadata. The spare area was originally sized to be large enough to accommodate enough bits to provide for ECC such as BCH (Bose Chaudhuri Hocqenghem) type codes for error correction given the expected error rates of memories at the time. Error correction codes are extensively used to correct read errors in NAND flash memories as they can be flexibly designed to correct a precise number of errors in a block of data, and are also relatively simple to implement decoders. However decoding data with ECC increases the latency of a read operation, and hence introduces delays in sending the data back to the host.

Further, reading data from NAND memory cells may involve multiple reads at varying threshold voltages. Due to the high memory cell density in flash memory arrays, the reads from a target row of cells in a memory array may also be influenced by the level of neighboring bits in the block. This degrades the quality of the read and increases the number of errors in the read data. Further, performing multiple reads is time consuming and has a severe negative impact on the performance of the flash memory controller which affects the QoS of the device.

SUMMARY

According to an embodiment of the present disclosure, there is provided a method for reading data from an SSD configured to store data in a plurality of memory cells arranged in memory blocks comprising rows, the method performed by a controller in communication with the plurality of memory cells. The method comprises retrieving data from a target row of memory cells of the plurality of memory cells associated with a read request received from a host using initial threshold voltages. The method includes decoding the data using a first hard decision decoding stage. Additionally, the method comprises estimating a BER of the target row of memory cells based on a distribution of threshold voltages of cells in a memory block containing the target row when the first hard decision decoding stage fails. Further, the method comprises classifying the BER of the target row based on a first BER threshold (BER-TH1). The method then comprises executing a first read flow comprising at least one hard decision decoding stage if the BER is less than the BER-TH1, and executing a second read flow similar to the first read flow if the BER is greater than or equal to the BER-TH1, the second read flow skipping a hard decision decoding stage of the first read flow.

According to another embodiment of the present disclosure, there is provided an SSD comprising a non-volatile semiconductor memory device comprising a plurality of memory cells for storing data, the memory cells arranged in memory blocks comprising rows, and a controller in communication with the plurality of memory cells. The controller is configured to retrieve data from a target row of memory cells of the plurality of memory cells associated with a read request received from a host using initial threshold voltages. The controller is also configured to decode the data using a first hard decision decoding stage, and estimate a BER of the target row of memory cells based on a distribution of threshold voltages of cells in a memory block containing the target row when the first hard decision decoding stage fails. Additionally, the controller is configured to classify the BER of the target row based on a first BER threshold (BER-TH1). Further, the controller is configured to execute a first read flow comprising at least one hard decision decoding stage if the BER is less than the BER-TH1, and execute a second read flow similar to the first read flow if the BER is greater than or equal to the BER-TH1, the second read flow skipping a hard decision decoding stage of the first read flow.

In some implementations, the method further comprises estimating mock threshold values of the target row of memory cells based on the distribution of threshold voltages of cells in the memory block containing the target row when the first hard decision decoding stage fails. In certain the BER classification of the target row based on the BER-TH1 and the estimation of mock threshold values occur together. In further implementations, the first read flow comprises retrieving data from the target row of memory cells using the mock threshold values associated with the target row of memory cells, and decoding the retrieved data using a second hard decision decoding stage.

In certain implementations, the first read flow comprises estimating modified read threshold values with compensation for inter-cell interference (ICI) of the target row of memory cells, and a neighboring row to the target row of memory cells, based on the distribution of threshold voltages of cells in the memory block containing the target row and the neighboring row, when the second hard decision decoding stage fails. The first read flow may further comprise retrieving data from the target row of memory cells and the neighboring row to the target row of memory cells using the modified mock threshold values associated with the target row and neighboring row of memory cells, and decoding the retrieved data using a third hard decision decoding stage. The first read flow may additionally comprise decoding the data retrieved using at least one soft decision decoding stage, each stage implemented with n-bit information where n is an integer greater than or equal to 2, when the third hard decision decoding stage fails.

In further implementations, the second read flow comprises estimating modified read threshold values with compensation for inter-cell interference (ICI) of the target row of memory cells, and a neighboring row to the target row of memory cells, based on the distribution of threshold voltages of cells in the memory block containing the target row and the neighboring row, when the first hard decision decoding stage fails. The second read flow may also comprise retrieving data from the target row of memory cells and the neighboring row to the target row of memory cells using the modified mock threshold values associated with the target row and neighboring row of memory cells, and decoding the retrieved data using a fourth hard decision decoding stage. The second read flow may additionally comprise decoding the data retrieved using at least one soft decision decoding stage, each stage implemented with n-bit information where n is an integer greater than or equal to 2, when the fourth hard decision decoding stage fails.

In some implementations, the first read flow further comprises estimating the BER of the target row of memory cells based on the distribution of threshold voltages of cells in the memory block containing the target row when the second hard decision decoding stage fails. The first read flow may also comprise classifying the BER of the target row based on a second BER threshold (BER-TH2). Additionally, the first read flow may comprise executing a first read sub-flow comprising at least one hard decision decoding stage if the BER is less than the BER-TH2, and executing a second read sub-flow similar to the first read sub-flow if the BER is great than or equal to the BER-TH2, the second read sub-flow skipping a hard decision decoding stage of the first read sub-flow.

In certain implementations, the first read sub-flow comprises estimating modified read threshold values with compensation for the ICI of the target row of memory cells, and a neighboring row to the target row of memory cells, based on the distribution of threshold voltages of cells in the memory block containing the target row and the neighboring row, when the second hard decision decoding stage fails. The BER classification of the target row based on the BER-TH2 and the estimation of modified mock threshold values may occur together. In further implementations, the first read sub-flow comprises retrieving data from the target row of memory cells and the neighboring row to the target row of memory cells using the modified mock threshold voltages associated with the target row and the neighboring row of memory cells, and decoding the retrieved data using a third hard decision decoding stage.

In some implementations, the first read sub-flow and/or the second read sub-flow may comprise decoding the data retrieved using at least one soft decision decoding stage, each stage implemented with n-bit information where n is an integer greater than or equal to 2, when the third hard decision decoding stage fails.

In further implementations, the second read sub-flow comprises estimating the BER of the target row of memory cells based on a distribution of threshold voltages of cells in a memory block containing the target row when the first hard decision decoding stage fails, classifying the BER of the target row based on a second BER threshold (BER-TH2), and executing a third read sub-flow comprising at least one hard decision decoding stage if the BER is less than the BER-TH2, and executing a fourth read sub-flow similar to the third read sub-flow if the BER is greater than or equal to the BER-TH2, the fourth read sub-flow skipping a hard decision decoding stage of the third read sub-flow. In some implementations, the third read sub-flow comprises estimating modified read threshold values with compensation for inter-cell interference (ICI) of the target row of memory cells, and a neighboring row to the target row of memory cells, based on the distribution of threshold voltages of cells in the memory block containing the target row and the neighboring row, when the first hard decision decoding stage fails. In some implementations, the BER classification of the target row based on the BER-TH2 and the estimation of modified mock threshold values may occur together.

In further implementations, the third read sub-flow comprises retrieving data from the target row of memory cells and the neighboring row to the target row of memory cells using the modified mock threshold values associated with the target row and the neighboring row of memory cells, and decoding the retrieved data using a fourth hard decision decoding stage. In some implementations, the third read sub-flow comprises decoding the data retrieved using at least one soft decision decoding stage, each stage implemented with n-bit information where n is an integer greater than or equal to 2, when the fourth hard decision decoding stage fails. In certain implementations, the fourth read sub-flow comprises decoding the data retrieved using at least one soft decision decoding stage, each stage implemented with n-bit information where n is an integer greater than or equal to 2, when the first hard decision decoding stage fails.

In some implementations, the first read flow comprises the first read sub-flow and the second read sub-flow. In further implementations, the second read flow comprises the third read sub-flow and the fourth read sub-flow. In other implementations, the initial threshold voltages are default factory values stored in a firmware of the controller or historical threshold voltages of the memory cells stored in a table in the controller. In certain implementations, the BER estimation is done using a linear fit, a nonlinear fit or a deep-neural network (DNN) based algorithm. In some implementations, the BER estimation is based on a physical row number, a program/erase cycle count, a read disturb count, and a mock threshold value of the memory cells associated with the read request. In certain implementations, the plurality of memory cells of the SSD comprise a NAND semiconductor memory.

BRIEF DESCRIPTION OF DRAWINGS

The foregoing and other objects and advantages will be apparent upon consideration of the following detailed description, taken in conjunction with the accompanying drawings, in which like reference characters refer to like parts throughout, and in which:

FIG. 7A illustrates a simplified read flow implemented with QT; FIG. 7B illustrates a simplified read flow implemented with QT and inter-cell interference (ICI) compensation;

DETAILED DESCRIPTION

Figure 1:
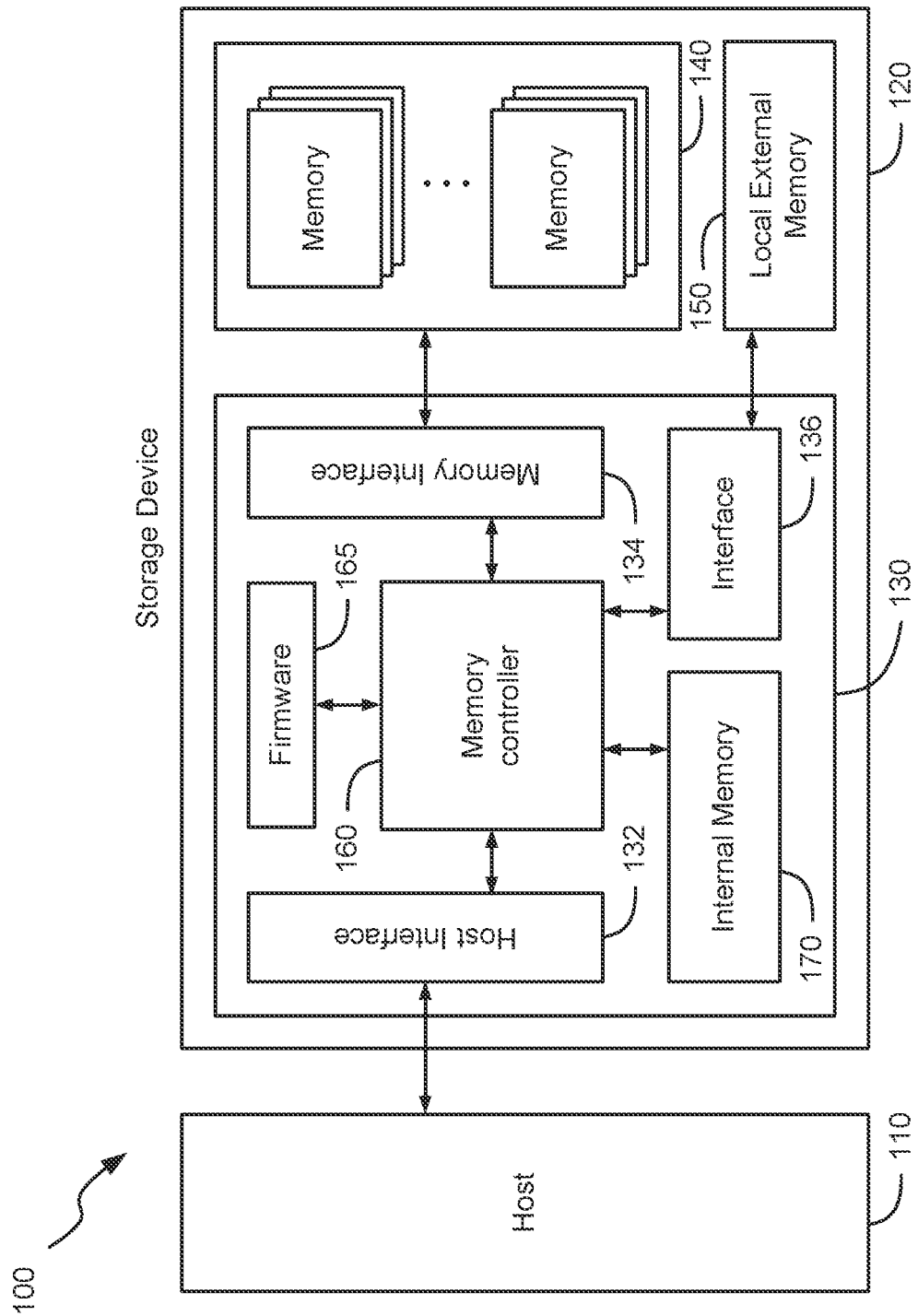
FIG. 1 illustrates a schematic representation of an SSD, configured according to one or
more embodiments of the present disclosure.

To provide an overall understanding of the devices described herein, certain illustrative embodiments will be described. Although the embodiments and features described herein are specifically described for use in connection with an SSD having a controller, it will be understood that all the components and other features outlined below may be combined with one another in any suitable manner and may be adapted and applied to other types of SSD architectures with memories having a similar need to improve the Quality of Service (QoS) and reduce read latency within the device.

As NAND technology evolves, the QoS requirements become more stringent. The QoS of a NAND device is highly affected by the read flow latency. The read flow includes decoding and READ operations that may induce high latency. In order to reduce this latency, informed decisions may be made during the read flow and appropriate decoding stages can be applied, while other decoding stages may be omitted or may be skipped if they are prone to fail.

The present disclosure provides a method for estimating or classifying the optimal BER at a given stage in the read flow using mock histogram values and their nonlinear transformations as input features. BER estimation herein refers to estimating a BER value of a target row, while BER classification herein refers to classifying the target page/row BER to belong to a specific class among a finite number of classes. The classes may be: (1) BER higher than or equal to a predefined threshold and (2) BER lower than a predefined threshold. While two classes have been exemplified, any number of classes may be defined within the scope of the present disclosure. The stage at which BER estimation is deployed may be, for example, after initial hard bit (HB) decoding failure, where this decoding is performed after execution of a READ command with default thresholds or history table (HT) thresholds. The estimated BER may then be used to decide whether to perform the next stage in the read flow or skip it and move directly to the following stage. While the present disclosure concerns BER estimation and calculation for optimizing a read flow, optimization of read thresholds have also been considered in U.S. patent application Ser. No. 18/122,758 entitled "Feature Based Read Threshold Estimation in NAND Flash Memory," filed on Mar. 17, 2023, the contents of which are hereby incorporated herein in entirety.

Hard decision decoding or hard bit decoding, as are used interchangeably herein, refers to an error correction mechanism which reads bits or a block of bits, and decodes each bit by considering it as definitely '1' or '0'. A hard decision decoding stage of a read flow samples the received pulses representing bits and compares their voltages to threshold values. If a voltage is greater than the threshold value, it is decoded as '1' and otherwise decoded as '0'. Soft decision decoding or soft bit decoding, as are used interchangeably herein, refers to a class of algorithms that takes bits or a block of bits and decodes them by considering a range of possible values that it may take. It considers the reliability of each received pulse to form better estimates of input data.

The present disclosure also provides methods for obtaining higher QoS in a NAND memory device by reducing read flow latency using estimated BER information. This is achieved by relying on a threshold voltage distribution across the memory cells of the device for estimating or classifying the optimal BER at the current stage in the read flow. Analysis of threshold voltage distribution across the memory cells of a flash device by using a Quick Training (QT) method and mock threshold histograms (collated in histogram bins) have been described in detail in U.S. Pat. No. 8,751,726 issued on Jun. 10, 2014 entitled "System and Methods Employing Mock Thresholds to Generate Actual Reading Thresholds in Flash Memory Devices," and U.S. Pat. No. 11,195,585 issued on Dec. 7, 2021 entitled "Calculating Shift Amounts for Read Voltage Correction," the contents of which are hereby incorporated herein in entirety.

QT involves mock reading of data for estimating the optimal read thresholds. The present disclosure shows that the mock reading data that is already available in the read flow can also be used for estimating or classifying the optimal BER at the current stage in the read flow. The mock reads are reads at fixed predetermined thresholds, termed 'mocks' that are chosen based on offline optimization. According to embodiments of the present disclosure, informed decisions can then be made, e.g. decoding stages to skip and stages to deploy, to optimize a read flow and improve the QoS of the memory device. For example, if the estimated optimal BER is high, QT failure may be predicted and thus, QT threshold estimation and its corresponding read operations are skipped and inter-cell-interference (ICI) compensated QT is implemented directly. Data and/or signal processing operations may be implemented on a NAND memory controller hardware and/or firmware, which lends itself to low complexity processing. In this manner, mock reading data is used not only for NAND read threshold optimization, but also for NAND BER estimation, with low system overhead. In this manner, the BER estimation result is used for optimizing the read flow and for minimizing the system latency overhead. It is within the scope of the present disclosure to alternatively use versatile QT, referenced below, for sequential reads without executing dedicated QT mock reads.

FIG. 1 is a block diagram of a memory system 100 comprising at least one host 110 in communication with a storage device 120. The host 110 is a computing system that comprises processors, memories, and other components as is generally known in the art, and which is not shown in FIG. 1 for the sake of brevity. Storage device 120 provides non-volatile storage functionality for use by the host 110. Storage device 120 may include an integrated circuit comprising a controller communicatively coupled to a memory such as an SSD or HDD. Such an integrated circuit may comprise a system-on-chip (SoC) 130. SoCs are advantageous as they provide a single integrated circuit that contains circuitry and components of the electronic system for the storage device 120 to function. SoC 130 may be communicatively coupled to a memory 140. Memory 140 may comprise SSD or HDD. In the case of memory 140 comprising an SSD, the memory 140 may additionally comprise a NAND semiconductor memory, such as a NAND based flash memory device. The memory 140 may be organized into pages, blocks, planes, die and chips. Memory 140 may comprise a plurality of NAND chips, such as, for example, 32, 64, 128, 256 separate NAND chips, and each NAND chip can be running separate commands on individual die (not shown) within the chip.

Storage device 120 may include a local memory external to the SoC 130, such as a dynamic random access memory ("DRAM") 150. Local external memory 150 comprises several buffers used to buffer data during read and write operations between the host 110 and the memory 140. Further, storage device 120 may comprise a host interface 132 which enables communication with the host 110 for the receipt of I/O commands and Vendor Unique Commands (VUCs). Storage device 120 may also include a memory interface 134 for communication with the memory 140 (through a plurality of channels, not shown), and an interface 136 for communication with the local external memory 150. Interface 132, on the SoC 130 may comprise a Serial Advanced Technology Attachment (SATA) connector or a NVMe™ connector (NVMe™ is an acronym for "NVM express," where "NVM" stands for "nonvolatile memory") operating with a PCIe™ ("Peripheral Component Interface Express") bus, for example. Interface 134 may comprise an Open NAND Flash Interface (ONFI) or a manufacturer's proprietary interface, for example. Interface 136 may comprise, for example, an interface according to, but not limited to: a Double Data Rate (DDR) memory bus standard such as DDR3, DDR4 or DDR5; a Low Power Double Data rate (LPDDR) memory bus standard such as LPDDR3, LPDDR4 or LPDDR5; a Hybrid Memory Cube (HMC) memory bus standard.

Also shown in FIG. 1 is a memory controller 160 that enables the storage device 120 to perform various functions such as processing VUC commands received from the host 110 as well as internal commands generated within the storage device 120 to maintain functionality (e.g. NVMe™ commands such as 'FormatNVM'). The storage device 120 also includes a Read-Only Memory (ROM) that stores firmware 165 for the operation of various states of the storage device 120. The firmware 165 comprises computer executable instructions that are executed by the controller 160 for operation of the storage device 120. The ROM is programmed with the firmware 165 during manufacture of the storage device 120 and may be re-programmed by the controller 160 as necessary. This allows the operation of the storage device 120 to be adapted as needed. The storage device 120 may also include an internal memory 170, such as a static random access memory ("SRAM"), that forms part of the same integrated circuit as the SoC 130. The internal memory 170 may be configured to store data such system metadata, mapping tables and bad block lists. In some embodiments, such data may also be stored in the local external memory 150.

Memory controller 160 may also comprise an error correction encoder and decoder. The decoder may comprise an Encryption and Error Correction Code (ECC) decoder communicatively coupled to a hard-decision decoder and a soft-decision decoder. The ECC decoder may also include a BCH error corrector or any other cyclic error corrector. Data written to the memory 140 is encoded with an ECC code in a first instance to give ECC-encoded data. To decode data from the memory, data from a target row of memory cells is passed through the hard-decision decoder, and, if required, the soft-decision decoder. Additionally, wear and tear of the device during its lifespan result in errors being introduced to the data when the data is read out from the memory device.

Figure 2:
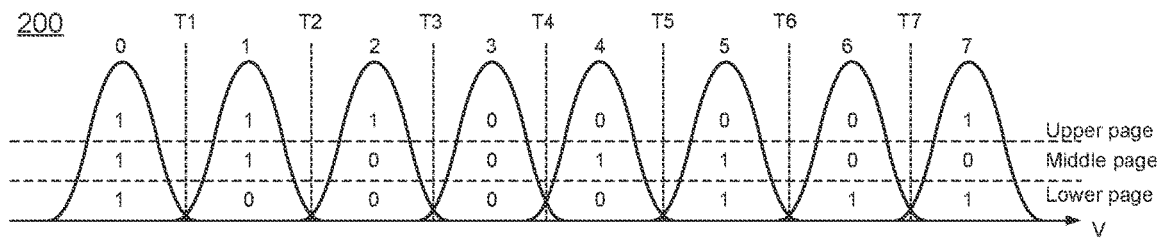
FIG. 2 illustrates exemplary threshold voltage distributions across the pages of a triple-layer cell (TLC) of a memory device.

FIG. 2 shows a threshold voltage distribution of an exemplary triple-level cell (TLC) of a flash memory device. TLCs store three bits per cell to describe $2^3$ states per cell stored in a three (lower, middle, and upper) pages. The threshold voltage distribution for each of the eight states of the TLC is shown in the eight lobes 0-7 of FIG. 2. Reading from the various pages of the TLC may be performed according to various threshold voltages. For example, a lower page read may be performed using thresholds T0 and T4, a middle page read requires using thresholds T1, T3 and T5, and a upper page read may be performed using thresholds T2 and T6. In most instances, the lower most lobe 0 is known as the erase level. While FIG. 2 illustrates the voltage distribution of a TLC, other cell architectures may also be used in a flash memory device. These include but are not limited to single-level cells (SLC) which stores one bit per cell, multi-level cells (MLC) which stores two bits per cell, and quad-level cells (QLC) which stores four bits per cell.

Notwithstanding, an error in reading from the lobes occurs when two neighboring lobes overlap or intersect. This is typically characterized by a bit error rate (BER). Knowing the optimal BER of a target row in a NAND device before performing a read operation (with optimal or suboptimal threshold voltages) can be very useful for determining if a subsequent operation (e.g. decoding) will succeed or fail. If the decoding failure probability is high, the operation is likely to fail and should be avoided or skipped. Instead, a more sophisticated read and decoding technique may be performed as these may have a higher probability of success. However, the optimal BER of a target row is not available during NAND device operation. Further, the computation of this optimal BER takes a long time and consumes significant computation power, rendering it impractical.

The BER of a target row may change significantly during the lifetime of the NAND device. Retention, program/erase (P/E) cycles and read disturb can change the voltage threshold distribution in different ways, as can be seen by the variation in T0-T6 in FIG. 2. This creates various BER conditions. When the NAND device reaches end of life (EOL) the BER of the rows of memory cells is usually beyond the decoding capability of typically implemented error correcting code (ECC) algorithms. Typical ECC algorithms include, but are not limited to, Hamming codes (for single bit error correction), Bose, Chaudhuri and Hocquenghem (BCH) codes (for MLC and TLC devices), and Low Density Parity Codes (LDPC). Thus, the BER of a target row or specific block in the NAND device should be estimated repeatedly during the device life cycle for efficient read flow with low latency. Such efficiency can be attained by choosing (or skipping) decoding stages that are deployed in a read flow when the controller executes a read command received from a host.

BER Estimation

According to an embodiment of the present disclosure, data and/or signal processing operations may be performed to estimate or classify the current BER of a NAND device to provide reliable information for reading/decoding of data from memory cells of a target page in the NAND device. Once the BER is estimated, a read flow with the most suitable decoding stages may be deployed. The proposed methods are suitable for any generation of NAND device and does not depend on the NAND flash storage density. It should be noted that embodiments of the present disclosure are described in relation to a NAND flash memory device comprising TLC cells. However it will be understood that embodiments of the present disclosure extend to any configuration and/or storage density of memory cells, such as SLC, MLC, and QLC, for example.

Linear Estimation. According to an embodiment of the present disclosure, a method to estimate the page BER of a target row is to use a linear combination of the distribution of threshold voltages such as mock histogram data, as reference above. For the three pages of a TLC NAND device, the estimation $\hat{V}_{3\times1}$ of the three page BER is:

$$\hat{V}_{3\times1} = X_{3\times8} \cdot H_{8\times1}$$

where $H_{8\times1}$ is the histogram threshold values obtained from mock reads (it has eight values), and $X_{3\times8}$ is the linear estimator coefficients matrix, trained offline on a database and saved by the NAND controller. The coefficient matrix $X_{3\times8}$, may be determined using a simple linear regression, as exemplified in FIG. 3A.

An algorithm may be used for flexible optimization of X. One method to obtain X is to use the least squares method by minimizing the page BER estimator mean squared error for previously described linear fit. Alternatively, other metrics such as mean absolute estimation error rather than mean squared error may be used. Outliers in the mock threshold histogram data may lead to exceptionally high BER estimation errors which may not be reflective of the mean performance of the memory device. In order to avoid such outliers, an iterative weighted least squares method is proposed. Here weights are employed and initialized to equal values or, alternatively, higher weights are employed for rows with high optimal BER as it is expected that the BER for these rows will be harder to estimate accurately. In any case, the weights are normalized such that their sum is one. A weighted least squares algorithm is then iteratively applied to determine X, where the weights are a function of the absolute page BER estimation error per row. For example, the second power of the current absolute estimation error can be used as weights for the following iteration. After each iteration the performance under the chosen metric is measured, and, if there is improvement compared to a previous iteration, the current linear estimator coefficients matrix, X, is saved. The maximum number of iterations is a hyperparameter of the optimization. If the weights do not change between iterations the optimization stops. Alternatively, the optimization of X can be stopped once the maximum number of iterations is reached. The linear estimator coefficients matrix, X, from the iteration with the best performance of the chosen metric is used.

Figure 3A:
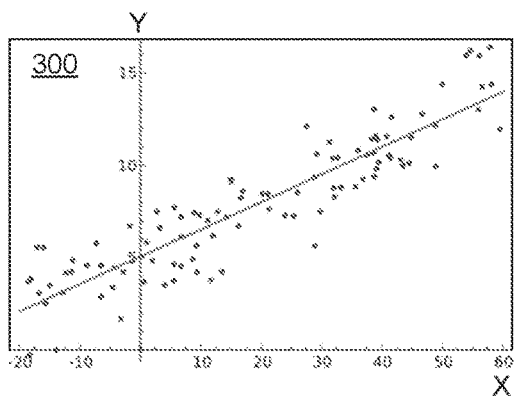
FIG. 3A illustrates an exemplary linear regression fit to data.
Figure 3B:
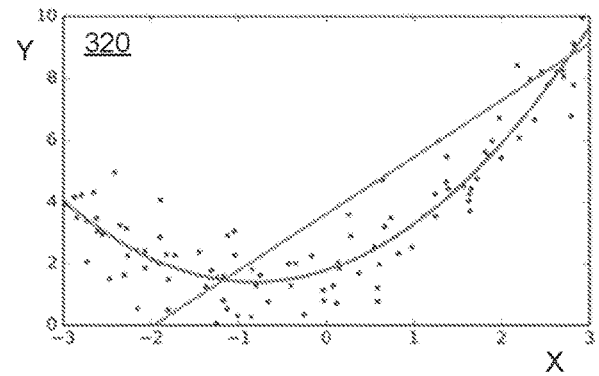
FIG. 3B illustrates an exemplary nonlinear fit to data in comparison to the linear fit of FIG. 3A.

Nonlinear Estimation. According to an embodiment of the present disclosure, a more advanced estimator that uses nonlinear transformations of the mock histogram may be used. Here, let $G_{M\times1}$ denote a vector of linear and nonlinear transformations of the mock histogram $H_{8\times1}$. For example, $$G = \begin{bmatrix} H \\ \vdots \\ H^N \end{bmatrix}_{8N\times1}, M = 8N$$

that includes different powers of H, may be used, where the powers are applied elementwise. Other examples to form G are to use roots of different orders of the elements in H, natural logarithm of the element in H, and products between the elements of H up to a certain order. Order 2 in this case means a product of each pair of elements of H, where a pair may include the same element twice. For the three pages of TLC, the estimation $\hat{V}_{3\times1}$ of the three page BER is:

$$\hat{V}_{3\times1} = Y_{3\times M} \cdot G_{M\times1}$$

where $G_{M\times1}$ is the vector of linear and nonlinear transformations of the mock histogram values H obtained from mock reads, and $Y_{3\times M}$ is the linear estimator coefficients matrix, trained offline on a database. The coefficient matrix Y can be obtained using a simple linear regression, as shown in FIG. 3A. It should be noted that estimation performance using G may improve compared to using H since the relation between the mock histogram values and the optimal BER may be nonlinear. Therefore, in some cases a polynomial fit between the mock histogram values and the optimal BER is more appropriate. Such a polynomial fit can be implemented by using G but not H. A polynomial fit provides a more appropriate estimation of a value compared to linear fit for data that behaves in a nonlinear fashion, as illustrated in FIG. 3B. In order to optimize Y, an iterative weighted least squares algorithm may be used, similar to the algorithm for optimizing X using the mock histogram values, as described above.

According to a further embodiment of the present disclosure, device feature selection for the optimization of X and Y is provided. Such feature selection tailors the above BER estimation to the hardware or memory constraints, and to reduce computation time. The coefficient matrix, Y, may be trained with a very large number of features and then feature selection methods can be applied to reduce Y to an acceptable size in terms of hardware and/or memory constraints. Feature selection can be implemented by replacing each feature with random noise and evaluating the amount of performance degradation, for example. Other feature selection methods that are within the scope of the present disclosure include filter based selection which eliminates features based on a chosen metric where features with highest scores remain, while other features are eliminated. Another method of feature selection is wrapper based where feature selection is implemented as a search problem such as recursive feature elimination. A further method of feature selection is via embedded methods using algorithms that have built in feature elimination such as Lasso.

Figure 3C:
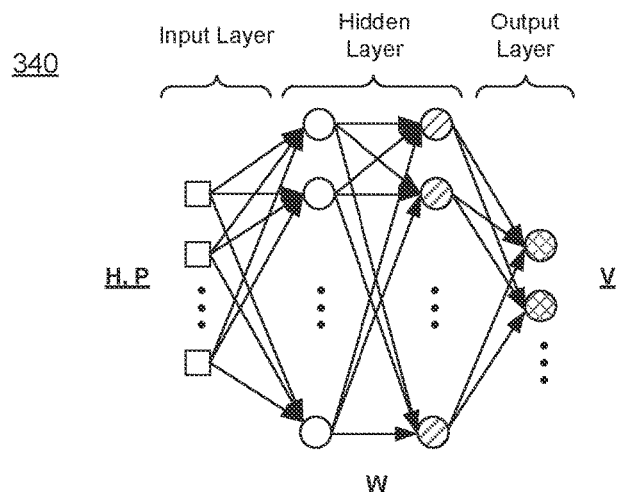
FIG. 3C illustrates an exemplary multilayer-perceptron deep neural network (DNN) with the use of features to fit data.

Deep-Neural Network Estimation. According to an embodiment of the present disclosure, the estimation $\hat{V}_{3\times1}$ of the three page BER can be obtained from a deep-neural network (DNN), as depicted in FIG. 3C. The figure shows an exemplary multi-layer perceptron (MLP) network which can be used to accurately estimate page errors of a NAND device using input features. Similar to linear regression, the DNN input features can be the computed histogram from the mock reads and its nonlinear transformations. The DNN facilitates BER estimation with a richer set of features, where weights and biases of the DNN that have been optimised offline would be provided to the controller in place of X and Y as described above. For the exemplary DNN of FIG. 3C, the input features may be G the generalized mock histogram vector that may include various nonlinear transformations of the original histogram values, and P additional features, such as but not limited to a physical row number, a program/erase cycle count, a read disturb count, mock thresholds. The vector P may contain all these features, or only some of them, as these features may be available information for the controller during a read operation.

Figure 4:
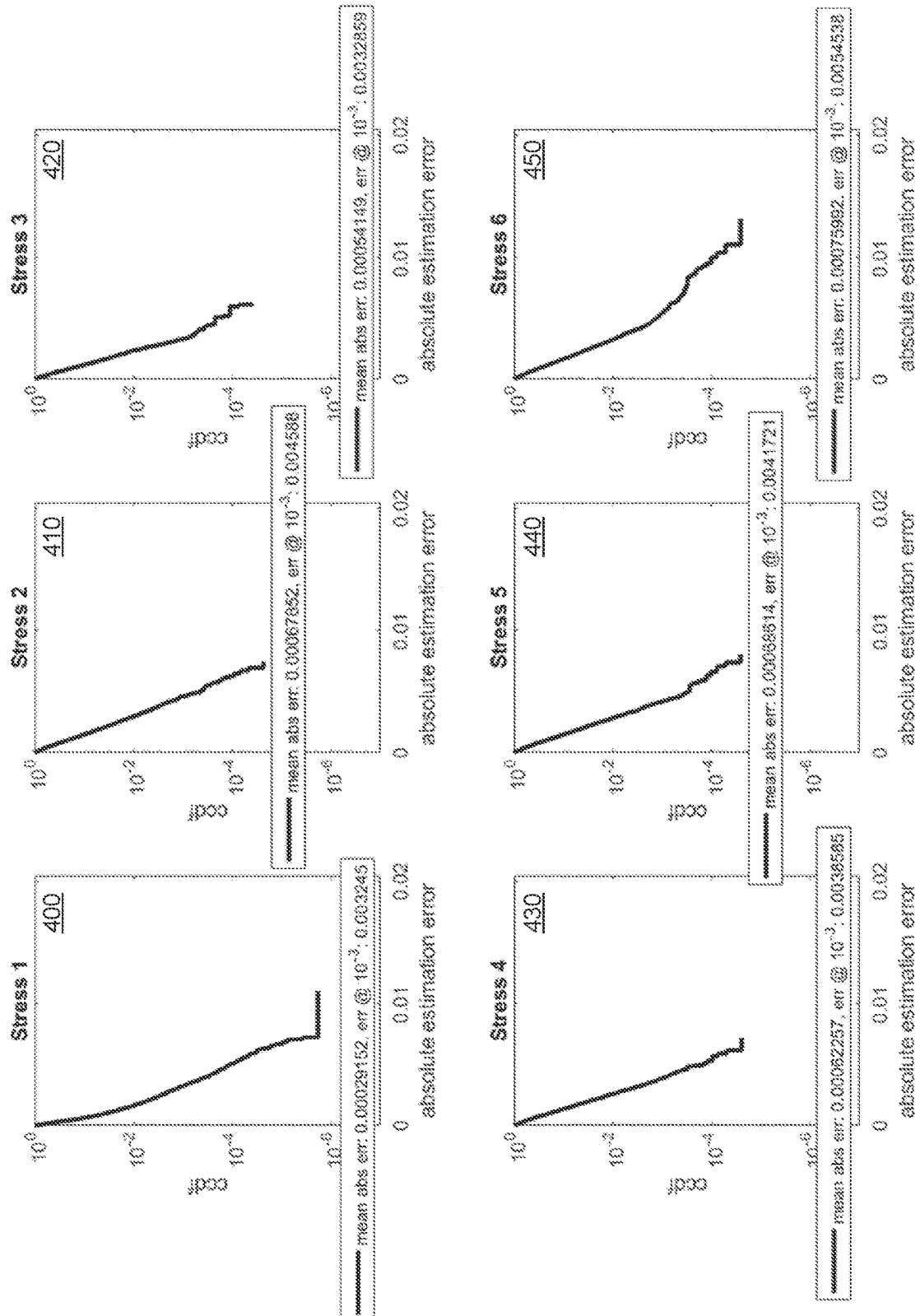
FIG. 4 illustrates the use of a complementary cumulative distribution function (CCDF) of absolute error in estimating the Bit Error Rate (BER) of a target row of cells under various stress conditions, according to one or more embodiments of the present disclosure.

FIG. 4 illustrates exemplary BER estimator performance for various stress conditions. The estimation method used is a fifth order polynomial fit with high BER oriented initial weights (higher initial weights on rows with high BER compared to rows with low BER). The performance is evaluated in terms of the Complementary Cumulative Density Function (CCDF) of the absolute estimation error, the mean absolute estimation error, and the BER where the CCDF reaches $10^{-3}$. The results are evaluated for six different stress conditions. As seen in FIG. 4 for all stress conditions, the mean absolute error is lower than $8 \times 10^{-4}$, where typical Error Correction Code (ECC) capability is around $10^{-2}$ for TLC NAND memory devices, which shows very good BER estimation accuracy.

BER Classification.

According to an embodiment of the present disclosure, after estimating the BER as described above, the estimated BER is classified by the controller. This is done by setting a threshold t where the controller performs binary classification and decides if the BER of a target row associated with a read command received from a host is smaller than t or greater than or equal to t. The choice of t can be tuned according to the ECC decoder capability given QT thresholds, for example. If the BER is classified to be lower than t, the decoding with current QT thresholds is predicted to succeed, while if the BER is classified to be higher than or equal to t the decoding with current QT thresholds is predicted to fail. If QT is predicted to fail, we can avoid or skip the read operation with its thresholds and move directly to a more sophisticated decoding algorithm like QT with ICI compensation, thereby improving decoding time and hence latency of the device.

Post Estimation Classification.

According to an embodiment of the present disclosure, post-estimation classification is performed by the controller where the target row BER is estimated by using a linear combination of the mock histogram bins. From the above, for the three page TLC the estimation $\hat{V}_{3\times1}$ of the three page TLC BER is $X_{3\times8} \cdot H_{8\times1}$, where $H_{8\times1}$ is the histogram values obtained from mock reads and $X_{3\times8}$ is the linear estimator coefficients matrix, trained offline on a database. Comparing each element of $\hat{V}=[\hat{v}_1, \hat{v}_2, \hat{v}_3]^T$ to t, the BER can be classified as:

$$BERclass = \begin{cases} lowBER, & \hat{v}_i < t \\ highBER, & \hat{v}_i \geq t \end{cases}, i = 1, 2, 3$$

Alternatively, the estimation of the target row BER is implemented by using $G_{M\times1}$ which is a vector of linear and nonlinear transformations of the mock histogram, $H_{8\times1}$. From the above, for the three page TLC the estimation $\hat{V}_{3\times1}$ of the three page TLC BER is $Y_{3\times M} \cdot G_{M\times1}$, where $G_{M\times1}$ is the vector of linear and nonlinear transformations of the histogram values, H, obtained from mock reads, and $Y_{3\times M}$ is the linear estimator coefficients matrix, trained offline on a database. Comparing each element of $\hat{V}=[\hat{v}_1, \hat{v}_2, \hat{v}_3]^T$ to t, the BER can be classified as:

$$BERclass = \begin{cases} lowBER, & \hat{v}_i < t \\ highBER, & \hat{v}_i \geq t \end{cases}, i = 1, 2, 3$$

As described above, estimation performance using G may improve compared to using H. Hence, classification performance may improve as well.

Classification with Logistic Regression.

Figure 5:
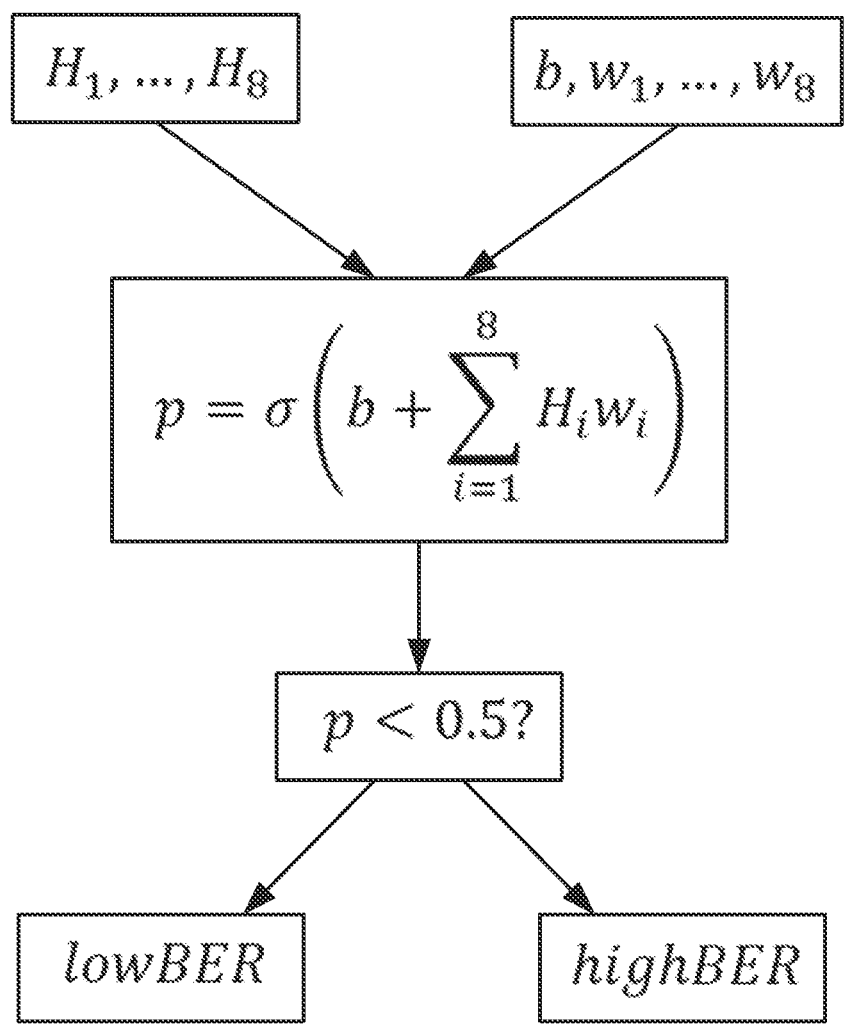
FIG. 5 illustrates a logistic regression for the classification of BER, according to one or more embodiments of the present disclosure.

According to another embodiment of the present disclosure, BER classification may also be done via logistic regression 500 shown FIG. 5. Here the input features could be the matrix $H_{8\times1}$, which is the histogram values obtained from mock reads, or the input features could be the matrix $G_{M\times1}$, which is the vector of linear and nonlinear transformations of $H_{8\times1}$. Next, a linear combination of the input features is applied and a sigmoid function of the result is computed in order to predict the probability that the BER is higher than or equal to the threshold t. The sigmoid function is defined as $$\sigma(x) = \frac{1}{1 + e^{-x}}.$$

If the estimated probability is less than 0.5 the BER is classified as lowBER. If the estimated probability is greater than or equal to 0.5, the BER is classified as highBER. The linear coefficients used before applying the sigmoid function are chosen from an offline training on a database with labeled data, e.g. '0' for lowBER and '1' for highBER.

Classification Using DNN.

According to a further embodiment of the present disclosure, the BER classification decision can be obtained using a deep-neural network (DNN), as shown in FIG. 3C. In this figure, there is an example of a multi-layer perceptron (MLP) network which can be used to classify accurately the page error to be lower than or higher than or equal to some threshold, t, using some input features. The DNN input features can be the computed histogram from the mock reads and its nonlinear transformations. A DNN BER classification facilitates a richer set of features as shown in FIG. 3C, where the input features may be $\overline{G}$ the generalized mock histogram vector that may include various nonlinear transformations of the original histogram values, and $\overline{P}$ additional features, such as but not limited to a physical row number, a program/erase cycle count, a read disturb count, mock thresholds. The vector $\overline{P}$ may contain all these features, or only some of them, as these features may be available information for the controller during a read operation.

Figure 6A:
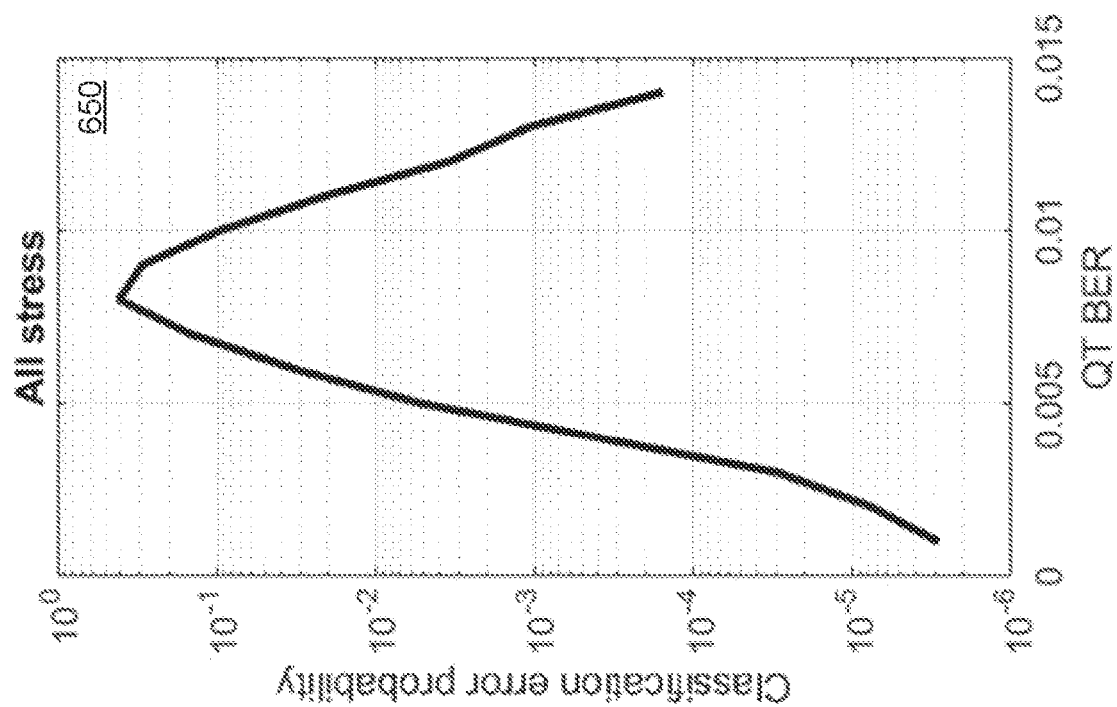
FIGS. 6A and 6B illustrate plots of classification error probability of optimal and quick trained (QT) BER, according to one or more embodiments of the present disclosure.
Figure 6B:
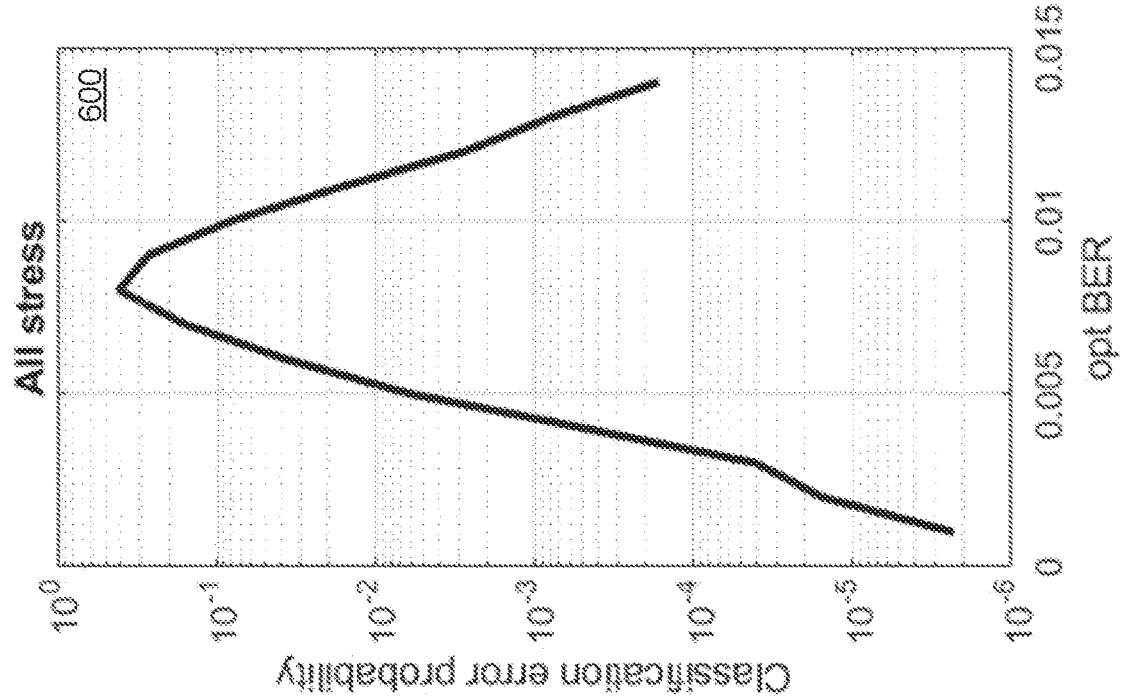

FIGS. 6A and 6B illustrate exemplary BER classification error probability of the classification method as described above, versus input BER of an entire database for threshold $t=8\times10^{-3}$. For this evaluation, $1\times10^{-3}$ wide binning around each x-axis value ($1\times10^{-3}$, $2\times10^{-3}$, ..., $19\times10^{-3}$, $20\times10^{-3}$) was used, and the classification error probability on each bin was determined. In FIG. 6A, the optimized BER (x-axis) is shown where binning was applied, and the error probability was computed and compared to optimal errors on which the classifier was trained. In FIG. 6B, the QT BER (x-axis) is shown, where binning is applied and error probability is computed and compared to QT errors. As can be seen in FIGS. 6A and 6B, the BER threshold t=0.008 is where the peaks occur, and as the BER becomes lower or higher than t, the classification error rapidly decreases, which indicates reliable classification performance.

An embodiment of the present disclosure uses the BER classification methods described above to optimize read flows when a controller of the NAND memory device processes a read command as received from a host. As mentioned above, the QoS of the device is highly affected by the read flow latency distribution. Thus, the present disclosure optimizes the read flows by skipping decoding stages based on the result of the BER classification, which reduces latency and improves the QoS of the device.

FIG. 7A illustrates a read flow 700 performed by the controller that includes the following stages, according to some implementations. Stage 710: Retrieve input thresholds for target row stored in controller. These input thresholds may be default factory settings written in the device firmware, or obtained from a history table stored in the controller. The input thresholds are then used for a page READ. Stage 720: A first hard bit (HB) or hard decision decoding is then performed on the read data. Stage 730: If the previous HB decoding stage fails, apply QT to obtain new thresholds, and page READ. Stage 740: A second HB decoding is performed. Stage 770: If the previous HB decoding stage fails, a soft bit (SB) decoding stage with 2-bit information (SB2) is performed. Stage 780: If the previous SB stage fails, a SB decoding stage with 5-bit information (SB5) is performed.

In order to understand the metrics involved in the above stages of the simplified read flow, the following assumptions are made: tRead=55 µS (single page read); SLC tRead=30 µS, QT fixed latency=3×tRead+30 µS+tRead=250 µS (3 page reads+30 µS for mock histogram computation); ICI fixed latency=SLC tRead+2×tRead=140 µS (the SLC read is for obtaining ICI information from neighbour word line); and SB2 latency=520 µS. With these assumptions, Table 1 provides the typical latency of the simplified read flow of FIG. 7A. It should be noted that all other computations during QT, QT ICI, and BER estimation/classification are assumed to have negligible latency and are omitted from the latency computation. For simplicity of analysis, the SB2 decoding stage is assumed to succeed. As seen in Table 1, the accumulated typical latency up to (not including) the SB2 stage is 397 µS.

TABLE 1

Latency and accumulated latency of simplified read flows, with and without ICI compensation, all in µS.

| Stage | Read Flow Step | Without ICI compensation (FIG. 7A) | | With ICI compensation (FIG. 7B) | |
|---|---|---|---|---|---|
| | | Latency | Acc. Latency | Latency | Acc. Latency |
| 710 | Retrieve Input thresholds | 57 | 57 | 57 | 57 |
| 720 | HB Decode (1) | 30 | 87 | 30 | 87 |
| 730 | QT | 250 | 337 | 250 | 337 |
| 740 | HB Decode (2) | 60 | 397 | 60 | 397 |
| 750 | QT with ICI compensation | — | — | 140 | 537 |
| 760 | HB Decode (3) | — | — | 60 | 597 |
| 770 | SB2 Sampling + Decoding | 520 | 917 | 520 | 1117 |
| 780 | SB5 Sampling + Decoding | N/A | N/A | N/A | N/A |

A probabilistic computation method of the latency CCDF of the simplified read flow 700 from FIG. 7A is described as follows. Let $f_{HB}(l)$ and $q_{HB}(l)$ denote the HB ECC latency probability density functions (PDFs) for two BER working points $RBER_{in}$ and $RBER_{QT}$, respectively. $RBER_{in}$ is the input BER to first HB decode operation on read-flow and $RBER_{QT}$ is the input BER to second HB decode operation after QT on read-flow. The read-flow latency CDF is defined as $$F_{Latency}(L) = Pr(l \le L) = \int_0^L dl_2 f_{HB}(l_2) \int_0^{l_{TH}(l_2)} dl_1 q_{HB}(l_1)$$

where the integration boundary $l_{TH}(l_2)$ is defined from the following latency relationship $l(l_1, l_2)=(1-FER_{in})l_2+FER_{in} \cdot [(I_{QT}+l_{maxHB1})+(1-FER_{QT}) \cdot l_1+FER_{QT} \cdot (l_{maxHB2}+l_{soft})]$, where $FER_{in}$ is the probability of HB decode error on input BER $RBER_{in}$, $FER_{QT}$ is the probability of HB decode error on input BER $RBER_{QT}$, $l_{QT}$ is the fixed QT latency (fixed amount of time that includes three page reads for mock reads, computation time, and a single page READ operation), $l_{maxHB1}$ is the latency on first HB operation failure with input BER $RBER_{in}$, $l_{maxHB2}$ is the latency on second HB operation failure with input BER $RBER_{QT}$, $l_{soft}$ is the latency on soft decoding (only SB2 is considered). The latency cumulative density function (CDF) can be computed for every pair of $RBER_{in}$ and $RBER_{QT}$, such that $P(RBER_{in}, RBER_{QT})=F_{Latency}(L)$, and the latency CCDF is given by:

$$\frac{1}{|DB|} \cdot \sum_{\{RBER_{in}, RBER_{QT}\} \in DB} 1 - P(RBER_{in}, RBER_{QT})$$

where DB is the set of measurement pairs of $RBER_{in}$ and $RBER_{QT}$ over the representative stress conditions testing.

FIG. 7B illustrates a read flow 750 performed by the controller similar to that of FIG. 7A, with compensation for inter-cell interference (ICI) from the cells of a neighboring word line to the target row in the NAND device after QT failure (stage 730), according to some implementations. ICI compensation is obtained by applying a single SLC read at a given threshold, TH, of a word line (WL)n+1 neighbor of a target row in word line WLn. Two ICI states are then defined by splitting the target row cells according to their neighbor programmed value (lower than or higher than or equal to TH). ICI compensation is then applied, where the compensation can be fixed with respect to QT thresholds or dynamic by applying QT for each state separately (a dynamic QT ICI compensation is assumed here for calculating the exemplary metrics in Table 1). Finally, two READ operations are applied, one READ for each ICI state according to its estimated read thresholds.

The read flow in FIG. 7B includes the following stages. Stage 710: Retrieve input thresholds for target row stored in controller. These input thresholds may be default factory settings written in the device firmware, or obtained from a history table stored in the controller. The input thresholds are then used for a page READ. Stage 720: A first hard bit (HB) or hard decision decoding is then performed on the read data. Stage 730: If the previous HB decoding stage fails, apply QT to obtain new thresholds, and page READ. Stage 740: A second HB decoding is performed. Stage 750: If the previous HB stage fails, apply QT with ICI compensation to obtain two sets of thresholds and two page READs. Stage

760: A third HB decoding is performed for each READ. Stage 770: If the previous HB decoding stage fails, a soft bit (SB) decoding stage with 2-bit information (SB2) is performed. Stage 780: If the previous SB stage fails, a SB decoding stage with 5-bit information (SB5) is performed. The QT with ICI compensation in Stage 750 may significantly reduce BER compared to QT in Stage 730, which provides a significantly higher probability of success for Stage 760 compared to Stage 740. Table 1 also provides the typical latency of the simplified read flow with ICI compensation of FIG. 7B. As shown in Table 1, the accumulated typical latency up to the SB2 stage is 5970, which is higher than the simplified read flow of FIG. 7A due to the additional QT ICI and HB decoding stages 750 and 760.

A probabilistic computation method of the latency CCDF of the simplified read flow 750 with ICI compensation from FIG. 7B is described as follows. Let $f_1(l)$, $f_2(l)$ and $f_3(l)$ denote the HB ECC latency PDF for all BER working points $RBER_{in}$, $RBER_{QT}$, $RBER_{ICI}$, where $RBER_{in}$ is the input BER to first HB decode operation on read-flow, $RBER_{QT}$ is the input BER to second HB decode operation after QT on read-flow, $RBER_{ICI}$ is the input BER to third HB decode operation after ICI compensation on read-flow. The read-flow latency CDF is defined as $$F_{Latency}(L) = Pr(l \le L) = \int_{l(l_1,l_2,l_3) \le L} f_1(l_1) f_2(l_2) f_3(l_3) dl_1 dl_2 dl_3$$

where $l(l_1, l_2, l_3) = (1-FER_{in})l_1 + FER_{in} \cdot [(l_{QT} + l_{maxHB1}) + (1-FER_{QT}) \cdot l_2 + FER_{QT} \cdot \{(l_{ICI} + l_{maxHB2}) + (1-FER_{ICI}) \cdot l_3 + FER_{ICI} \cdot (l_{maxHB3} + l_{soft})\}]$. $FER_{in}$ is the probability of HB decode error on input BER $RBER_{in}$, $FER_{QT}$ is the probability of HB decode error on input BER $RBER_{QT}$, $FER_{ICI}$ is the probability of HB decode error on input BER $RBER_{ICI}$, $l_{QT}$ is the fixed QT latency (fixed amount of time that includes three page reads for mock reads, small computation time, and a single page READ operation), $l_{ICI}$ is the fixed ICI compensation latency (fixed amount of time that includes a single SLC read and two page READ operations). $l_{maxHB1}$ is the latency on the first HB operation failure with input BER $RBER_{in}$, $l_{maxHB2}$ is the latency on the second HB operation failure with input BER $RBER_{QT}$, $l_{maxHB3}$ is the latency on the third HB operation failure with input BER $RBER_{ICI}$, $l_{soft}$ is the latency on soft decoding (only SB2 is considered). The latency CDF can be computed for every triplet of $RBER_{in}$, $RBER_{QT}$, and $RBER_{ICI}$ such that $P(RBER_{in}, RBER_{QT}, RBER_{ICI}) = F_{Latency}(L)$ and the latency CCDF is given by:

$$\frac{1}{|DB|} \cdot \sum_{\{RBER_{in}, RBER_{QT}, RBER_{ICI}\} \in DB} 1 - P(RBER_{in}, RBER_{QT}, RBER_{ICI})$$

where DB is the set of measurement triplets of $RBER_{in}$, $RBER_{QT}$, and $RBER_{ICI}$ over the representative stress conditions testing.

Figure 8:
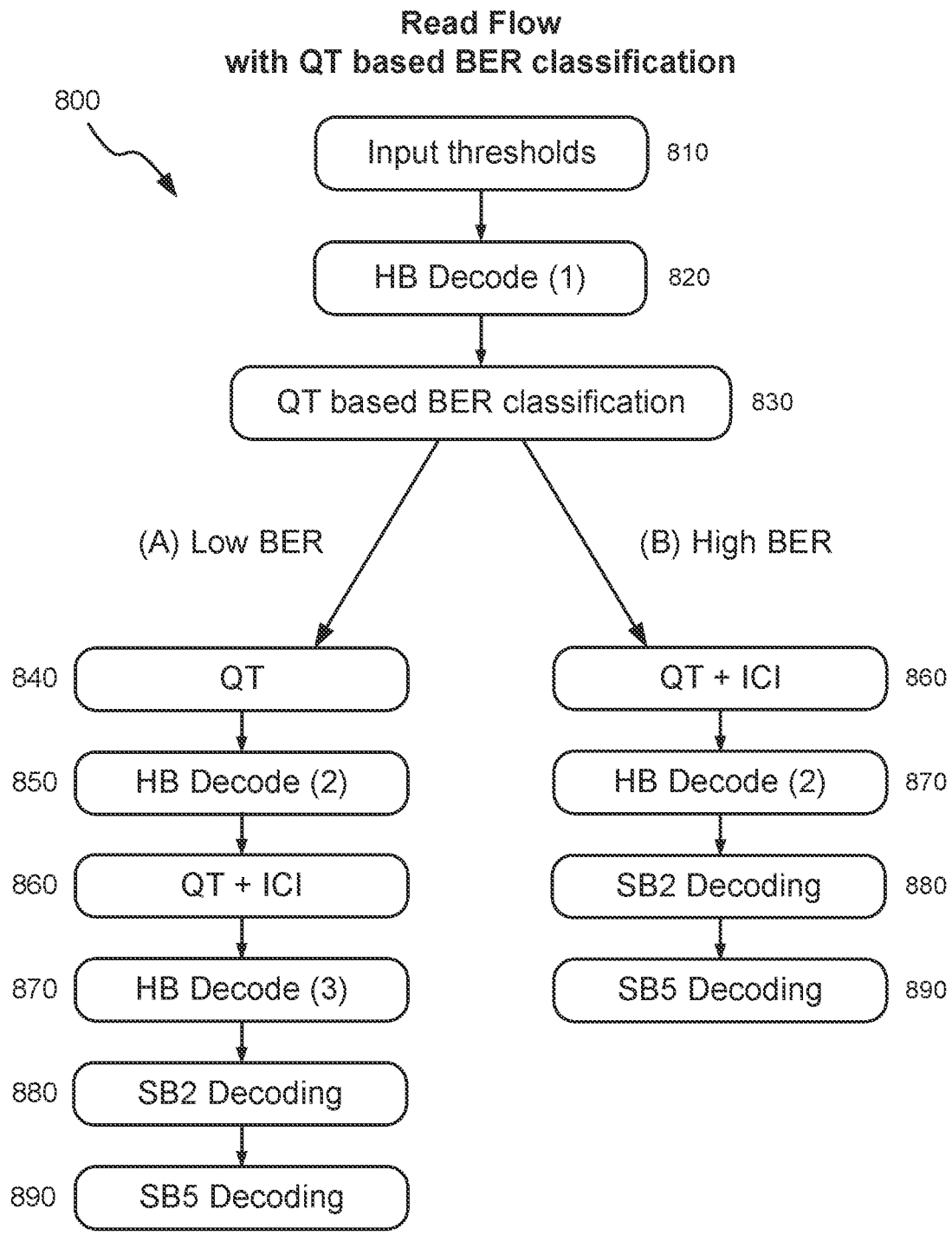
FIG. 8 illustrates a read flow implemented with QT based BER classification, according to one or more embodiments of the present disclosure.

FIG. 8 illustrates a new read flow 800 with QT based BER classification according to an embodiment of the present disclosure. Read flow 800 includes a stage for deciding whether to apply QT if the estimated BER is classified as low, or go directly to QT with ICI compensation if the estimated BER is classified as high. BER classification can be implemented using any of the methods described above, such as, for example, linear fit, nonlinear fit, DNN. The BER classification stage and its result are used for deciding whether to apply or skip some read flow decoding stages if they are prone to fail. This capability may significantly reduce the read flow latency as the chance of a failed READ attempt is reduced, as will be described and exemplified below.

The stages involved in read flow 800 are as follows. Stage 810: Retrieve input thresholds for target row stored in controller. These input thresholds may be default factory settings written in the device firmware, or obtained from a history table stored in the controller. The input thresholds are then used for a page READ. Stage 820: A first hard bit (HB) or hard decision decoding is then performed on the read data. Stage 830: If the previous HB stage fails, apply QT based BER classification and split the read flow based on whether the BER is classified as (i) a low BER if an estimated BER is less than a threshold BER t (as described above) or BER-TH1, or (ii) a high BER if the estimated BER is equal to or more than t or BER-TH1.

The read flow applied after QT based classification as low BER is as follows. Stage 840: If the previous HB decoding stage 820 fails, apply QT to obtain new thresholds, and page READ. It should be noted that Stages 830 and 840 share the same mock reading data where Stage 830 estimates the BER and classifies the BER as low or high with respect to t, and Stage 840 determines the read thresholds to be used in subsequent HB decoding stages. This is because the BER classification is implemented using the mock reading data to classify the page BER as low or high. Stage 850: A second HB decoding is performed using the mock thresholds from QT. Stage 860: If the previous HB stage 850 fails, apply QT with ICI compensation to obtain two sets of thresholds and two page READs. Stage 870: A third HB decoding is performed for each READ. Stage 880: If the previous HB decoding stage 870 fails, a soft bit (SB) decoding stage with 2-bit information (SB2) is performed. Stage 890: If the previous SB stage 880 fails, a SB decoding stage with 5-bit information (SB5) is performed.

Figure 9:
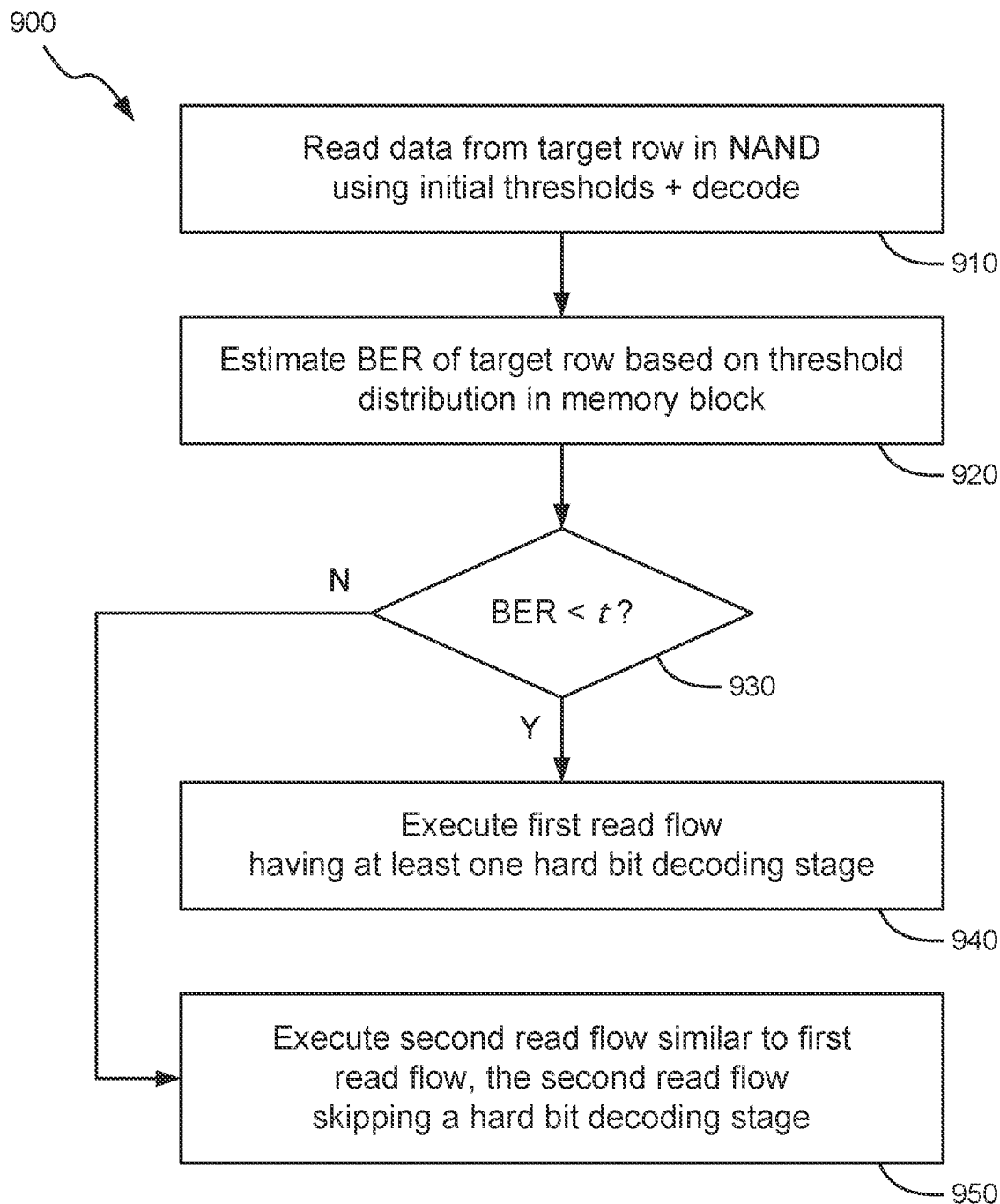
FIG. 9 is a flow diagram of a method for the read flow in FIG. 8, according to one or more embodiments of the present disclosure.

FIG. 9 illustrates an exemplary flow diagram of a method 900 describing a read flow with QT based BER classification, according to an embodiment of the present disclosure. Method 900 is reflective of the read flow 800 in FIG. 8. Method 900 may be carried out by the controller 160 of the SSD 120, as described in the foregoing. Method 900 begins at step 910 where the controller reads data from a target row in the NAND memory specified in a read command received from a host. The read command executed using initial thresholds that may be default factory settings written in the device firmware, or obtained from a history table stored in the controller. The controller then performs hard bit decoding on the read data. Step 910 is based on stages 810 and 820 of read flow 800. The method then progresses to step 920 where the BER of the target row is estimated based on the threshold distribution in the memory block of the NAND device containing the target row, e.g. mock reads are applied and BER of the target row is estimated. Steps 920 and 930 are based on stage 830 of read flow 800. If the hard bit decoding in step 910 fails, the controller classifies the data based on the BER in step 930 where the target row is considered to have a low BER if the estimated BER is less than a threshold BER t ('Y' at step 930). Conversely, the controller classifies the target row as having a high BER if the estimated BER is at least equal to t ('N' at step 930).

If the estimated BER of the target row is classified as a low BER, the controller progresses to step 940 where a first read flow comprising at least one hard bit decoding stage is executed. The first read flow as referenced in step 940 may comprise read flow stages 840-890. If the estimated BER of the target row is classified as a high BER, the controller progresses to step 950 where a second read flow is executed. Here, the second read flow is similar to the first read flow but skips a page read with QT thresholds and corresponding hard bit decoding stage. The second read flow referenced in step 950 may comprise read flow stages 860-890. In effect, for low BER, steps 910-940 in FIG. 9 map onto read flow stages 810-830 and stages 840-890 in path (A) of FIG. 8. For high BER, steps 910-930 and 950 in FIG. 9 map onto read flow stages 810-830 and stages 860-890 in path (B) of FIG. 8.

Table 2 provides the latency of the new read flow 800 with QT based BER classification. The QT based BER classification has essentially zero latency in read flow 800 since the three page mock reads for TLC and mock histogram computation latency are taken into account as part of the QT (e.g. the classification is done using existing data). Thus, the read flow latency shown in Table 2 (low BER) is similar to that shown in Table 1 (with ICI compensation).

Further, the QT based BER classification has essentially zero latency in the read flow latency from Table 2 since the three page mock reads for TLC and mock histogram computation latency are taken into account as part of the QT ICI. Comparing Tables 1 and 2, it can be seen that the accumulated typical latency before the SB2 stage is only 482 µS (see Stage 870 accumulated latency for high BER classification in Table 2) as opposed to 597 µS (see Stage 760 accumulated latency for QT with ICI compensation in Table 1). This is a 115 µS reduction. The reduced latency is due to the ability to make BER driven decisions during the read flow 800 and skip stages that are prone to fail, e.g. the QT stage 840 and associated HB decode stage 850.

TABLE 2

Latency and accumulated latency for QT based BER classification read flows for low and high BER, all in µS.

| | | (A) Low BER | | (B) High BER | |
|---|---|---|---|---|---|
| Stage | Read Flow Step | Latency | Acc. Latency | Latency | Acc. Latency |
| 810 | Retrieve Input thresholds | 57 | 57 | 57 | 57 |
| 820 | HB Decode (1) | 30 | 87 | 30 | 87 |
| 830 | QT based BER classification | ~0 | 87 | ~0 | 87 |
| 840 | QT | 250 | 337 | skip | skip |
| 850 | HB Decode (2) | 60 | 397 | skip | skip |
| 860 | QT with ICI compensation | 140 | 537 | 335 | 422 |
| 870 | HB Decode (3) | 60 | 597 | 60 | 482 |
| 880 | SB2 Sampling + Decoding | 520 | 1117 | 520 | 1002 |
| 890 | SB5 Sampling + Decoding | N/A | N/A | N/A | N/A |

The latency distribution of the read flow 800 with QT based BER classification is described as follows, where for successful decoding is assumed after SB2. Here two types of read-flow latency CDFs are computed: (1) CDF given low BER decision and (2) CDF given high BER decision. The latency CDF used depends on the actual BER classifier decision. For Low BER decision, use read-flow latency CDF described for FIG. 7B, denoted by $P_{LB}(RBER_{in}, RBER_{QT}, RBER_{ICI})$. For high BER decision, use new read flow described as follows. Let $f_{HB}(l)$ and $g_{HB}(l)$ denote the HB ECC latency PDF for two BER working points $RBER_{in}$ and $RBER_{ICI}$, respectively, where $RBER_{in}$ is the input BER to the first HB decode operation on read-flow, and $RBER_{ICI}$ is the input BER to the second HB decode operation after QT ICI compensation on read-flow (given high BER decision). The read-flow latency CDF is defined by $$P_{HB}(RBER_{in}, RBER_{ICI}) = \int_0^L dl_2 f_{HB}(l_2) \int_0^{l_{TH}(l_2)} dl_1 g_{HB}(l_1)$$

where the integration boundary $l_{TH}(l_2)$ is defined from the following latency relationship $l(l_1, l_2) = (1 - FER_{in})l_2 + FER_{in} \cdot [(l_{maxHB1} + l_{ICI}) + (1 - FER_{ICI}) \cdot l_1 + FER_{ICI} \cdot (l_{maxHB2} + l_{soft})]$.

The CDF can be computed for every pair of $RBER_{in}$ and $RBER_{ICI}$, where $l_{ICI}$ is the fixed ICI compensation latency (fixed amount of time that includes three page reads for mock reads, small computation time, single SLC read, and two page READ operations). Next, let us denote $BER_{class} \in \{LowBER, HighBER\}$, the BER classifier decision. The latency CDF can be computed for every quadruplet of $RBER_{in}, RBER_{QT}, RBER_{ICI},$ and $BER_{class}$ such that $P(RBER_{in}, RBER_{QT}, RBER_{ICI} | BER_{class}) =$ $\begin{cases} P_{LB}(RBER_{in}, RBER_{QT}, RBER_{ICI}), & BER_{class} = LowBER \\ P_{HB}(RBER_{in}, RBER_{ICI}), & BER_{class} = HighBER \end{cases}$ Using the law of total probability, $F_{Latency}(L) = P(RBER_{in}, RBER_{QT}, RBER_{ICI}) = P$
$(BER_{class} = LowBER) \cdot P(RBER_{in}, RBER_{QT}, RBER_{ICI} | BER_{class} = LowBER) + P$
$(BER_{class} = HighBER) \cdot P(RBER_{in}, RBER_{QT}, RBER_{ICI} | BER_{class} = HighBER) = P$
$(BER_{class} = LowBER) \cdot P_{LB}(RBER_{in}, RBER_{QT}, RBER_{ICI}) + P(BER_{class} = HighBER) \cdot P_{HB}(RBER_{in}, RBER_{ICI})$ The latency CCDF is given by:

$$\frac{1}{|DB|} \cdot \sum_{(RBER_{in}, RBER_{QT}, RBER_{ICI}, BER_{class}) \in DB} 1 - P(RBER_{in}, RBER_{QT}, RBER_{ICI} | BER_{class})$$

where DB is the set of measurement quadruplets of $RBER_{in}, RBER_{QT}, RBER_{ICI},$ and $BER_{class}$ over the representative stress conditions testing.

Figure 10:
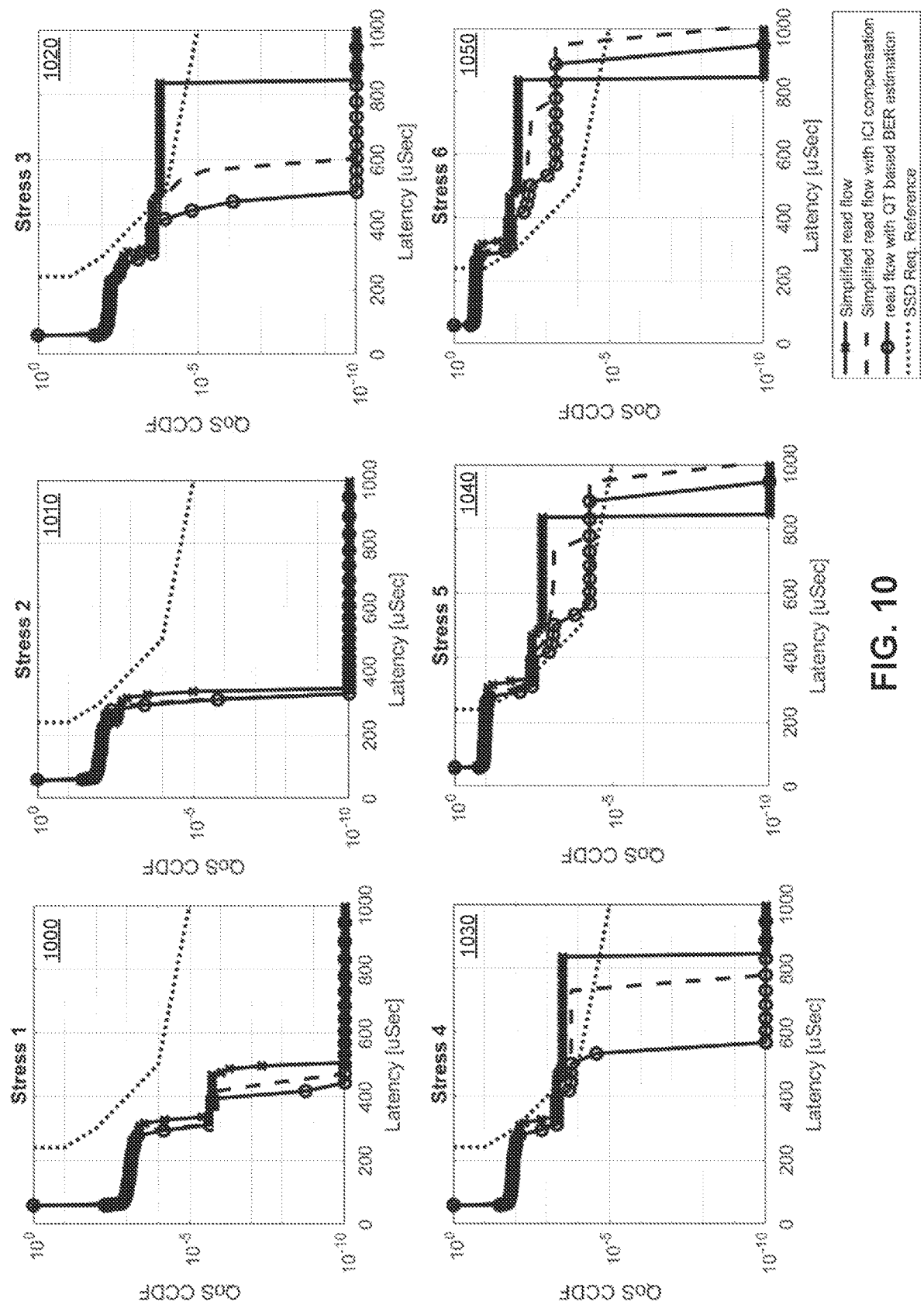
FIG. 10 illustrates the QoS performance of various read flows in terms of latency CCDF, according to one or more embodiments of the present disclosure.

FIG. 10 shows the QoS performance of a NAND device in terms of latency CCDF of the simplified read flow from FIG. 7A (solid line curve with x markers), the simplified read flow with ICI compensation from FIG. 7B (dashed line curve), and the read flow with QT based BER classification from FIG. 8 (solid line curve with circle markers) under various stress conditions as shown in plots 1000-1050. The latency CCDFs of the different read flows are compared to the solid state drive (SSD) specification requirements (dotted black curve). Under Stress 1, gain from using the BER estimator of approximately 300 µS and approximately 400 µS can be seen compared to the simplified read flow with ICI compensation. These gains are due to the direct application of QT ICI after failure of the first HB decoding operation.

Under Stress 2, all read flow methods have similar performance since this stress includes pages with relatively low BER. Minor latency loss of the BER estimator is observed around 300 µS compared to the simplified read flows, due to cases where a QT ICI stage is deployed instead of QT (high BER decision) and both methods lead to successful HB decoding.

Under Stress 3, gain from using the BER estimator around 400 µS compared to simplified read flow with ICI compensation can be observed. This gain is due to the direct application of QT ICI after failure of the first HB decoding operation, and in doing so avoiding QT failure. Moreover, in Stress 3 the QT based BER classification read flow allows meeting the SSD specification requirements while the simplified read flow does not meet these requirements and the simplified read flow with ICI compensation is borderline.

Under Stress 4, significant gain from using the BER estimator around 400 μS compared to simplified read flow with ICI compensation can be seen. This gain is due to avoiding QT failure by directly applying QT ICI and succeeding after failure of the first HB decoding operation. Moreover, in Stress 4 the QT based BER classification read flow allows approaching the SSD specification requirements while the simplified read flow and the simplified read flow with ICI compensation noticeably violate the specification constraints.

Under Stress 5, significant gains from using the BER estimator around 400 μS and 550 μS compared to simplified read flow with ICI compensation. These gains are due to avoiding QT failure by directly applying QT ICI and succeeding after failure of the first HB decoding operation. Some degradation of BER estimation read flow compared to simplified read flow with no ICI is observed around 850 μS. This small performance loss is due to QT ICI failure and happens with very small probability (lower than $10^{-4}$).

Under Stress 6, significant gains from using the BER estimator around 400 μS and 550 μS compared to simplified read flow with ICI compensation can be observed. These gains are due to avoiding QT failure by directly applying QT ICI and succeeding after failure of the first HB decoding operation. Similar to the results from Stress 5, some degradation of BER classification read flow compared to simplified read flow with no ICI is observed around 850 μS. This small performance loss is due to QT ICI failure and happens with small probability (lower than $10^{-3}$).

Figure 11:
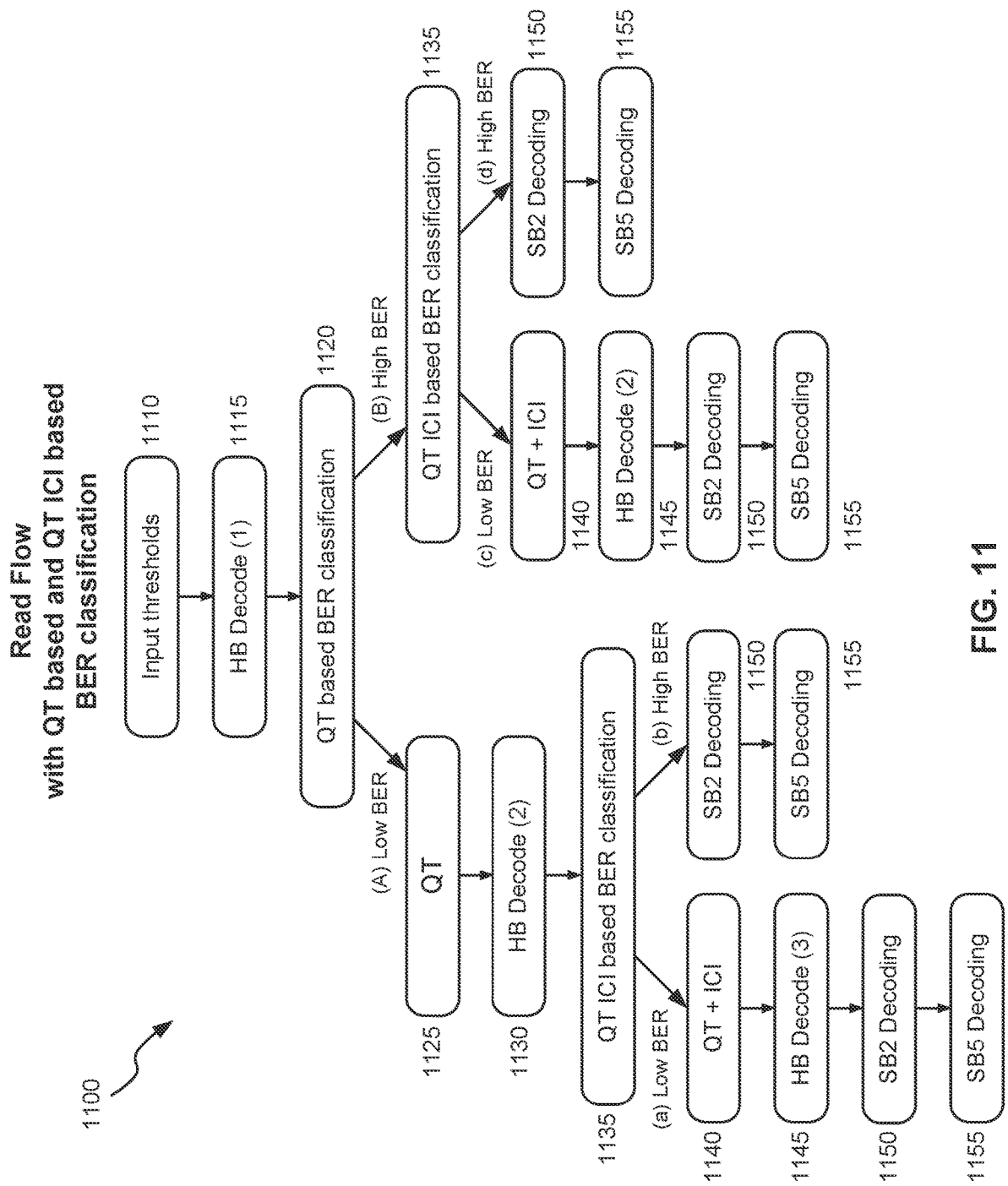
FIG. 11 illustrates a read flow implemented with QT and QT-ICI based BER classification, according to one or more embodiments of the present disclosure.

FIG. 11 illustrates a new read flow 1100 with QT based BER classification and QT ICI BER classification, according to an embodiment of the present disclosure. As described above, the QT based BER classification stage is used for deciding whether to apply QT (if BER is classified as low) or go directly to QT ICI (if BER is classified as high). As previously mentioned, QT based BER classification can be implemented using any of the methods described above, such as, for example, linear fit, nonlinear fit, DNN. This BER classification stage can help avoiding cases where QT is prone to fail and thus significantly reduce latency since a failed READ attempt is avoided. The QT ICI based BER classification stage is used for deciding whether to apply QT ICI (if post ICI compensation BER is classified as low) or go directly to SB2 decoding (if post ICI compensation BER is classified as high). The QT ICI based BER classification can also be implemented using any of the methods described above, such as, for example, linear fit, nonlinear fit, DNN. The main difference of the QT ICI based BER classification from the QT based BER classification is that the basic mock histogram $H_{8\times1}$ which is the histogram values obtained from mock reads is replaced by:

$$K_{16\times1} = \begin{bmatrix} K^{(1)}_{8\times1} \\ K^{(2)}_{8\times1} \end{bmatrix}$$

where $K^{(1)}_{8\times1}$ is the conditional mock histogram values given ICI state 1 (WL n+1 neighboring cells programed lower than TH) and $K^{(2)}_{8\times1}$ is the conditional mock histogram values given ICI state 2 (WL n+1 neighboring cells programed higher than or equal to TH). It should be noted that $K^{(1)}_{8\times1}+K^{(2)}_{8\times1}=H_{8\times1}$. This QT ICI based BER classification stage can help avoid cases where QT ICI is prone to fail and thus significantly reduce latency since failed READ attempts are avoided, as will be described and exemplified below.

The stages involved in read flow 1100 are as follows. Stage 1110: Retrieve input thresholds for target row stored in controller. These input thresholds may be default factory settings written in the device firmware, or obtained from a history table stored in the controller. The input thresholds are then used for a page READ. Stage 1115: A first hard bit (HB) or hard decision decoding is then performed on the read data. Stage 1120: If the previous HB stage fails, apply QT based BER classification and split the read flow based on whether the BER is classified as (i) a low BER if an estimated BER is less than a first threshold BER-TH1, or (ii) a high BER if the estimated BER is equal to or more than BER-TH1.

The read flow applied after QT based classification 1120 as low BER (path 'A' in FIG. 11) is as follows. Stage 1125: If the previous HB decoding stage 1115 fails, apply QT to obtain new thresholds, and page READ. It should be noted that Stages 1120 and 1125 share the same mock reading data where Stage 1120 classifies the BER as low or high with respect to BER-TH1, and Stage 1125 determines read thresholds to be used in subsequent HB decoding stages. Stage 1130: A second HB decoding is performed using the mock thresholds from QT. Stage 1135: If the previous HB stage 1130 fails, the controller applies QT ICI based BER classification and split the read flow based on whether the BER is classified as (i) a low BER if an estimated BER is less than a second threshold BER-TH2, or (ii) a high BER if the estimated BER is equal to or more than BER-TH2.

The read flow applied after QT ICI based classification 1135 as low BER (path 'a' in FIG. 11) is as follows. Stage 1140: If the previous HB decoding stage 1130 fails, apply QT ICI to obtain two sets of thresholds and two page READs. It should be noted that Stages 1135 and 1140 share the same QT ICI where Stage 1135 estimates the QT ICI BER and classifies the BER as low or high with respect to BER-TH2, and Stage 1140 determines the two sets of thresholds to be used in subsequent HB decoding stages. This is because the classification is done using the QT ICI data to determine the two sets of thresholds. Stage 1145: A third HB decoding is performed for each READ. Stage 1150: If the previous HB decoding stage 1145 fails, a soft bit (SB) decoding stage with 2-bit information (SB2) is performed. Stage 1155: If the previous SB stage 1150 fails, a SB decoding stage with 5-bit information (SB5) is performed.

The read flow applied after QT ICI based classification 1135 as high BER (path 'b' in FIG. 11) is as follows. Stage 1150: If the previous HB decoding stage 1130 fails, the controller skips QT ICI and associated HD decoding stages (stages 1140 and 1145, respectively), and applies a soft bit (SB) decoding stage with 2-bit information (SB2) is performed. Stage 1155: If the previous SB stage 1150 fails, a SB decoding stage with 5-bit information (SB5) is performed.

The read flow applied after QT based classification 1120 as high BER (path '13' in FIG. 11) is as follows. Stage 1135: If the previous HB decoding stage 1115 fails, the controller skips QT and associated HD decoding stages (stages 1125 and 1130, respectively), and applies QT ICI based BER classification and splits the read flow based on whether the BER is classified as (i) a low BER if an estimated BER is less than a second threshold BER-TH2, or (ii) a high BER if the estimated BER is equal to or more than BER-TH2.

The read flow applied after QT ICI based classification 1135 as low BER (path 'c' in FIG. 11) is as follows. Stage 1140: If the previous HB decoding stage 1115 fails, apply QT ICI to obtain two sets of thresholds and two page READs. It should be noted that Stages 1135 and 1140 share the same QT ICI where Stage 1135 estimates the QT ICI BER and classifies the BER as low or high with respect to BER-TH2, and Stage 1140 determines the two sets of thresholds to be used in subsequent HB decoding stages. This is because the classification is done using the QT ICI data to determine the two sets of thresholds. Stage 1145: A second HB decoding is performed for each READ. Stage 1150: If the previous HB decoding stage 1145 fails, a soft bit (SB) decoding stage with 2-bit information (SB2) is performed. Stage 1155: If the previous SB stage 1150 fails, a SB decoding stage with 5-bit information (SB5) is performed.

The read flow applied after QT ICI based classification 1135 as high BER (path 'd' in FIG. 11) is as follows. Stage 1150: If the previous HB decoding stage 1115 fails, the controller skips QT ICI and associated HD decoding stages (stages 1140 and 1145, respectively), and applies a soft bit (SB) decoding stage with 2-bit information (SB2) is performed. Stage 1155: If the previous SB stage 1150 fails, a SB decoding stage with 5-bit information (SB5) is performed.

Figure 12:
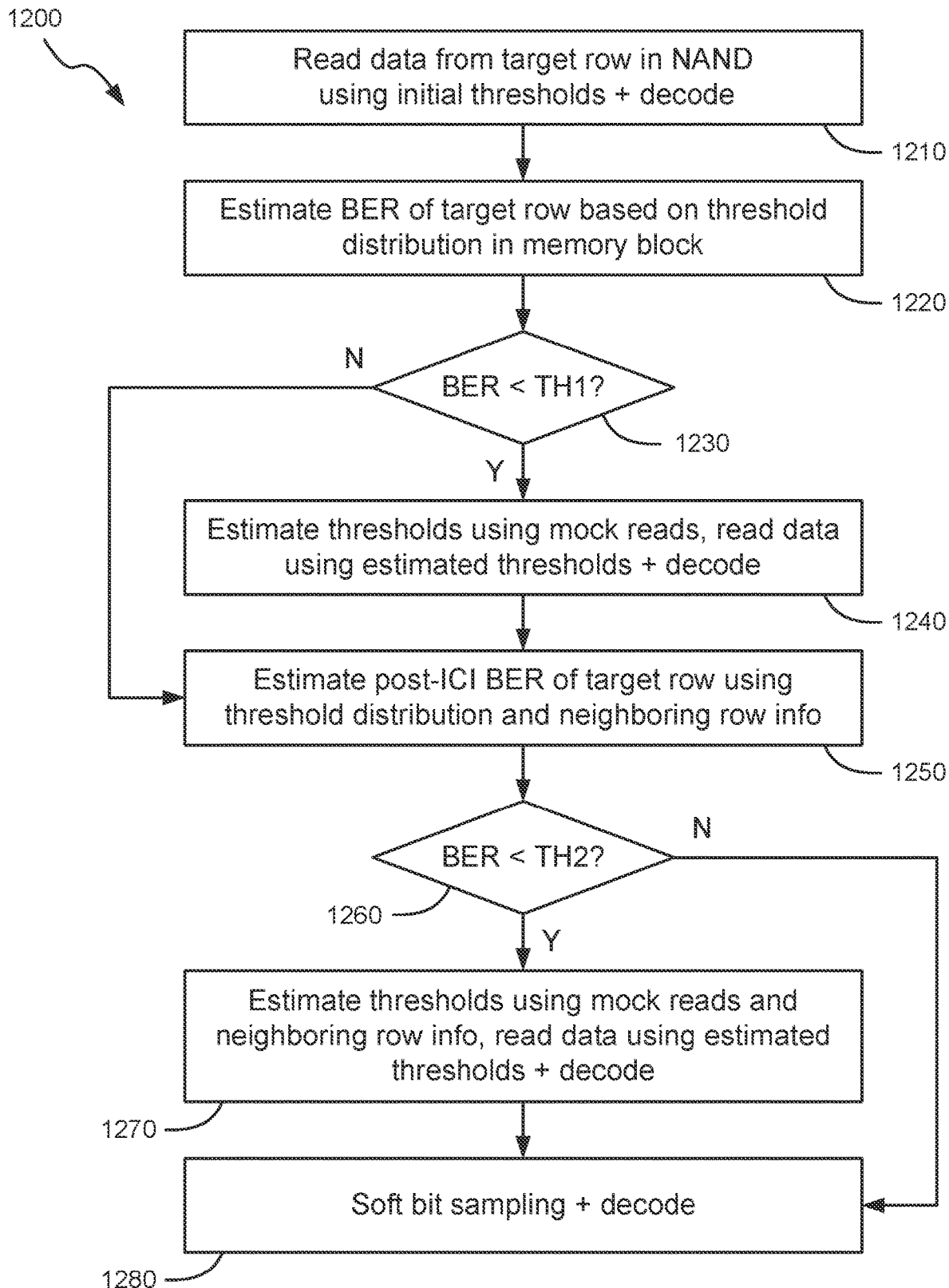
FIG. 12 is a flow diagram of a method for the read flow in FIG. 10, according to one or more embodiments of the present disclosure.

FIG. 12 illustrates an exemplary flow diagram of a method 1200 describing a read flow with QT and QT ICI based BER classification, according to an embodiment of the present disclosure. Method 1200 is reflective of the read flow 1100 in FIG. 11. Method 1200 may be carried out by the controller 160 of the SSD 120, as described in the foregoing. Method 1200 begins at step 1210 where the controller reads data from a target row in the NAND memory specified in a read command received from a host. The read command executed using initial thresholds that may be default factory settings written in the device firmware, or obtained from a history table stored in the controller. The controller then performs hard bit decoding on the read data. Step 1210 is based on stages 1110 and 1115 of read flow 1100. The method then progresses to step 1220 where the BER of the target row is estimated based on the threshold distribution in the memory block of the NAND device containing the target row, e.g. QT is applied and BER of the target row is estimated. Step 1220 is based on stage 1120 of read flow 1100. If the hard bit decoding in step 1210 fails, the controller classifies the data based on the BER in step 1230 where the target row is considered to have a low BER if the estimated BER is less than a threshold BER-TH1 ('Y' at step 1230). Conversely, the controller classifies the target row as having a high BER if the estimated BER is at least equal to BER-TH1 ('N' at step 1230).

If the estimated BER of the target row is classified as a low BER, the controller progresses to step 1240 and applies QT to estimate thresholds using mock reads and performs a page READ using the estimated thresholds, followed by hard bit decoding. Step 1240 is based on stages 1125 and 1130 of read flow 1100. If the hard bit decoding in step 1240 fails, the controller then applies QT ICI based BER classification and estimates the post-ICI BER of the target row in step 1250 using the threshold distribution of the block and neighboring row information. The method then classifies the data based on the post-ICI BER in step 1260 where the target row is considered to have a low BER if the estimated BER is less than a threshold BER-TH2 ('Y' at step 1260). Conversely, the controller classifies the target row as having a high BER if the estimated BER is at least equal to BER-TH2 ('N' at step 1260) and progresses to soft bit decode the data (step 1280). Steps 1250 and 1260 are based on stage 1135 of the read flow 1100.

If the estimated BER of the target row is classified as a low BER, the controller progresses to step 1270 and applies QT with ICI compensation to obtain two sets of estimated thresholds using mock reads and neighboring row information, and performs two READs using the estimated thresholds. Each of the reads are then hard bit decoded. Step 1270 is based on stages 1140 and 1145 of read flow 1100. If the hard bit decoding in step 1270 fails, the controller proceeds to step 1280 where soft bit decoding is used to decode the data. Step 1280 is based on stages 1150 and 1155 of read flow 1100. It should be noted that the progression of successive steps 1210-1280 is indicative of a suboptimal read flow when the BER of the target row is high as unnecessary hard bit decoding stages were used to decode the data (when the controller should have used soft bit decoding straight away once a high BER was detected).

Embodiments of the present disclosure provide for skipping step 1240 if QT based BER classification indicates that the BER of the target row is high ('N' at step 1230). A further embodiment of the present disclosure provides for skipping step 1270 if post-ICI BER classification indicates that the BER of the target row is high ('N' at step 1260). Skipped steps 1240 and 1270 involve hard bit decoding which takes time to execute. For high BER, executing such hard bit decoding may be fruitless as they may lead to failure, prompting the use of soft bit decoding. Thus, by enabling the controller to skip such stages of the read flow, the latency, and ultimately the QoS of the NAND memory device would improve. In effect, for low BER: (1) steps 1210-1280 in FIG. 12 map onto read flow stages 1100-1120 and stages 1125-1130 in path (A) and stages 1140-1155 in path (a) of FIG. 11; and (2) steps 1210-1250 and 1280 in FIG. 12 map onto read flow stages 1100-1120 and stages 1125-1130 in path (A) and stages 1150-1155 in path (b) of FIG. 11. For high BER: (1) steps 1210-1230 and 1260-1280 in FIG. 12 map onto read flow stages 1100-1120 and stage 1135 in path (B) and stages 1140-1155 in path (c) of FIG. 11; and (2) steps 1210-1230, 1260 and 1280 in FIG. 12 map onto read flow stages 1100-1120 and stage 1135 in path (B) and stages 1150-1155 in path (d) of FIG. 11.

Table 3 provides the latency of the new read flow 1100 with QT and QT ICI based BER classification. Turning to columns (A)(a) of Table 3 for a low BER decisions for both QT and QT ICI, the QT based BER classification has essentially zero latency in read flow 1100 since the three page mock reads for TLC and mock histogram computation latency are taken into account as part of the QT (e.g. the classification is done using existing data). The QT ICI based BER classification has also essentially zero latency since the ICI is an SLC read which is also taken into account as part of the QT ICI stage. Thus, the read flow typical latency from columns (A)(a) of Table 3 is similar to values shown in Tables 1 and 2. Turning to columns (B)(c) of Table 3 for a high BER decision for QT and a low BER decision for QT ICI, and comparing with the values in Table 2, it can observed that the accumulated typical latency before the SB2 stage is similar since QT was skipped and QT ICI was deployed instead.

From the latency in columns (A)(b) of Table 3 for a low BER decision for QT and a high BER decision for QT ICI, it can be seen that QT ICI based BER classification has 30 μS latency such that the ICI SLC read is taken into account although the QT ICI is skipped (see map of (A)(b) in FIG. 11 which skips read flow stages 1140 and 1145). Here, the accumulated typical latency in Table 3 before the SB2 stage is 427 µS, and is lower than the accumulated typical latency in column (B)(c) of Table 3 before the SB2 stage, which is 482 µS. This is because QT requires only one page read, while QT ICI requires two page reads.

Further, from the latency in columns (B)(d) of Table 3 for a high BER decision for both QT and QT ICI, it can be seen that the accumulated typical latency before the SB2 stage is 312 µSand is significantly lower than the accumulated typical latency in column (A)(a) of Table 3 before the SB2 stage, which is 597 µS. The reason is that deploying QT and QT ICI following by HB decoding failures require three additional page reads (overall 165 µS) and two (failing) HB decoding operations (overall 120 µS). Thus, according to embodiments of the present disclosure, accurate high BER detection during read flow can yield significant latency reduction.

In the foregoing, all recitation of "layer" and "engine" should be taken to mean a plurality of circuits within the controller that facilitates the function as described. Such circuits may comprise electronic components formed on a semiconductor chip, such as, for example, transistors and resistors. It should be noted that the term "about" or "approximately" in the foregoing indicates a range of ±20% of the stated value. Additionally, in the foregoing, all recitation of "command," "action" or "function" should be taken to be based on algorithms and instructions stored on a non-transitory computer-readable medium, that, when executed by a processor, causes a controller of an integrated circuit of a solid-stated drive (SSD) to perform the command, action or function. All recitation of "device," "memory," and "dies" are used interchangeably when used in relation to the NAND non-volatile semiconductor

TABLE 3

Latency and accumulated latency for QT based BER classification read flow, and QT with ICI based BER classification read flow, all in µS.

| | QT based: | (A) Low BER | | | | (B) High BER | | | |
|---|---|---|---|---|---|---|---|---|---|
| | QT ICI based: | (a) Low BER | | (b) High BER | | (c) Low BER | | (d) High BER | |
| Stage | Read Flow Step | Latency | Acc. Latency | Latency | Acc. Latency | Latency | Acc. Latency | Latency | Acc. Latency |
| 1110 | Retrieve Input Thresholds | 57 | 57 | 57 | 57 | 57 | 57 | 57 | 57 |
| 1115 | HB Decode (1) | 30 | 87 | 30 | 87 | 30 | 87 | 30 | 87 |
| 1120 | QT BER classification | ~0 | 87 | ~0 | 87 | ~0 | 87 | 195 | 282 |
| 1125 | QT | 250 | 337 | 250 | 337 | Skip | Skip | Skip | Skip |
| 1130 | HB Decode (2) | 60 | 397 | 60 | 397 | Skip | Skip | Skip | Skip |
| 1135 | QT ICI BER classification | ~0 | 397 | 30 | 427 | ~0 | 87 | 30 | 312 |
| 1140 | QT ICI | 140 | 537 | Skip | Skip | 335 | 422 | Skip | Skip |
| 1145 | HB Decode (3) | 60 | 597 | Skip | Skip | 60 | 482 | Skip | Skip |
| 1150 | SB2 Decoding | 520 | 1117 | 520 | 947 | 520 | 1002 | 520 | 832 |
| 1155 | SB5 Decoding | N/A | N/A | N/A | N/A | N/A | N/A | N/A | N/A |

A further embodiment of the present disclosure involves the use BER estimation and classification during versatile QT. Versatile QT is a complementary/alternative algorithm to the Pendulum algorithm (see U.S. Pat. No. 11,195,585 referenced above and incorporated by reference herein in entirety). The Pendulum objective is to maintain the NAND device fail-bit count (FBC) lower than the HB limit. Pendulum operates at specified patrol read times, and the Pendulum algorithm uses thresholds from previous patrol read operation and ECC errors per-threshold to update read thresholds. Here versatile QT can serve as an alternate/complement algorithm to Pendulum, so as to function when ECC data is not available. The versatile QT algorithm uses current read thresholds and corresponding read result as input features instead of mock reads, and may use ECC data as additional input features. Versatile QT does not require additional page reads as in regular QT. Thus, for example, versatile QT can be used for initial BER estimation based on its histogram features and only if estimated BER is classified as high, we execute QT or QT ICI. In a sequential read case, using versatile QT before executing QT for BER estimation and classification, and for read thresholds optimization, might help reduce the overhead induced by QT. This versatile QT could be used for BER estimation and classification, and could also be used for switching read flows based on its estimated BER value.

memory device. The term "similar" as used herein indicates close to identical but for a stated difference.

Other objects, advantages and embodiments of the various aspects of the present invention will be apparent to those who are skilled in the field of the invention and are within the scope of the description and the accompanying drawings. For example, but without limitation, structural or functional elements might be rearranged consistent with the present invention. Similarly, principles according to the present invention could be applied to other examples, which, even if not specifically described here in detail, would nevertheless be within the scope of the present invention.

The invention claimed is:

1. A method for reading data from a solid-state drive (SSD) configured to store data in a plurality of memory cells arranged in memory blocks comprising rows, the method performed by a controller in communication with the plurality of memory cells, the method comprising:
retrieving data from a target row of memory cells of the plurality of memory cells associated with a read request received from a host using initial threshold voltages;
decoding the data using a first hard decision decoding stage;
estimating a bit error rate (BER) of the target row of memory cells based on a distribution of threshold voltages of cells in a memory block containing the target row when the first hard decision decoding stage fails;

classifying the BER of the target row based on a first BER threshold (BER-TH1); and executing a first read flow comprising at least one hard decision decoding stage if the BER is less than the BER-TH1, and executing a second read flow similar to the first read flow if the BER is greater than or equal to the BER-TH1, the second read flow skipping a hard decision decoding stage of the first read flow.

2. The method of claim 1, further comprising:
estimating mock threshold values of the target row of memory cells based on the distribution of threshold voltages of cells in the memory block containing the target row when the first hard decision decoding stage fails.

3. The method of claim 2, wherein the BER classification of the target row based on the BER-TH1 and the estimation of mock threshold values occur together.

4. The method of claim 2, wherein the first read flow comprises:
retrieving data from the target row of memory cells using the mock threshold values associated with the target row of memory cells; and
decoding the retrieved data using a second hard decision decoding stage.

5. The method of claim 4, wherein the first read flow comprises:
estimating modified read threshold values with compensation for inter-cell interference (ICI) of the target row of memory cells, and a neighboring row to the target row of memory cells, based on the distribution of threshold voltages of cells in the memory block containing the target row and the neighboring row, when the second hard decision decoding stage fails.

6. The method of claim 5, wherein the first read flow comprises:
retrieving data from the target row of memory cells and the neighboring row to the target row of memory cells using the modified mock threshold values associated with the target row and neighboring row of memory cells; and
decoding the retrieved data using a third hard decision decoding stage.

7. The method of claim 6, wherein the first read flow comprises:
decoding the data retrieved using at least one soft decision decoding stage, each stage implemented with n-bit information where n is an integer greater than or equal to 2, when the third hard decision decoding stage fails.

8. The method of claim 4, wherein the first read flow further comprises:
estimating the BER of the target row of memory cells based on the distribution of threshold voltages of cells in the memory block containing the target row when the second hard decision decoding stage fails;
classifying the BER of the target row based on a second BER threshold (BER-TH2); and
executing a first read sub-flow comprising at least one hard decision decoding stage if the BER is less than the BER-TH2, and executing a second read sub-flow similar to the first read sub-flow if the BER is great than or equal to the BER-TH2, the second read sub-flow skipping a hard decision decoding stage of the first read sub-flow.

9. The method of claim 8, wherein the first read sub-flow comprises:
estimating modified read threshold values with compensation for the ICI of the target row of memory cells, and a neighboring row to the target row of memory cells, based on the distribution of threshold voltages of cells in the memory block containing the target row and the neighboring row, when the second hard decision decoding stage fails.

10. The method of claim 9, wherein the BER classification of the target row based on the BER-TH2 and the estimation of modified mock threshold values occur together.

11. The method of claim 9, wherein the first read sub-flow comprises:
retrieving data from the target row of memory cells and the neighboring row to the target row of memory cells using the modified mock threshold voltages associated with the target row and the neighboring row of memory cells; and
decoding the retrieved data using a third hard decision decoding stage.

12. The method of claim 11, wherein the first read sub-flow comprises:
decoding the data retrieved using at least one soft decision decoding stage, each stage implemented with n-bit information where n is an integer greater than or equal to 2, when the third hard decision decoding stage fails.

13. The method of claim 8, wherein the second read sub-flow comprises:
decoding the data retrieved using at least one soft decision decoding stage, each stage implemented with n-bit information where n is an integer greater than or equal to 2, when the second hard decision decoding stage fails.

14. The method of claim 1, wherein the second read flow comprises:
estimating modified read threshold values with compensation for inter-cell interference (ICI) of the target row of memory cells, and a neighboring row to the target row of memory cells, based on the distribution of threshold voltages of cells in the memory block containing the target row and the neighboring row, when the first hard decision decoding stage fails.

15. The method of claim 14, wherein the second read flow comprises:
retrieving data from the target row of memory cells and the neighboring row to the target row of memory cells using the modified mock threshold values associated with the target row and neighboring row of memory cells; and
decoding the retrieved data using a third hard decision decoding stage.

16. The method of claim 15, wherein the second read flow comprises:
decoding the data retrieved using at least one soft decision decoding stage, each stage implemented with n-bit information where n is an integer greater than or equal to 2, when the third hard decision decoding stage fails.

17. The method of claim 1, wherein the second read flow further comprises:
estimating the BER of the target row of memory cells based on a distribution of threshold voltages of cells in a memory block containing the target row when the first hard decision decoding stage fails;
classifying the BER of the target row based on a second BER threshold (BER-TH2); and executing a first read sub-flow comprising at least one hard decision decoding stage if the BER is less than the BER-TH2, and executing a second read sub-flow similar to the first read sub-flow if the BER is greater than or equal to the BER-TH2, the second read sub-flow skipping a hard decision decoding stage of the first read sub-flow.

18. The method of claim 17, wherein the first read sub-flow comprises:
estimating modified read threshold values with compensation for inter-cell interference (ICI) of the target row of memory cells, and a neighboring row to the target row of memory cells, based on the distribution of threshold voltages of cells in the memory block containing the target row and the neighboring row, when the first hard decision decoding stage fails.

19. The method of claim 18, wherein the BER classification of the target row based on the BER-TH2 and the estimation of modified mock threshold values occur together.

20. The method of claim 18, wherein the first read sub-flow comprises:
retrieving data from the target row of memory cells and the neighboring row to the target row of memory cells using the modified mock threshold values associated with the target row and the neighboring row of memory cells; and
decoding the retrieved data using a third hard decision decoding stage.

21. The method of claim 20, wherein the first read sub-flow comprises:
decoding the data retrieved using at least one soft decision decoding stage, each stage implemented with n-bit information where n is an integer greater than or equal to 2, when the third hard decision decoding stage fails.

22. The method of claim 17, wherein the second read sub-flow comprises:
decoding the data retrieved using at least one soft decision decoding stage, each stage implemented with n-bit information where n is an integer greater than or equal to 2, when the first hard decision decoding stage fails.

23. A solid-state drive (SSD) comprising:
a non-volatile semiconductor memory device comprising a plurality of memory cells for storing data, the memory cells arranged in memory blocks comprising rows; and
a controller in communication with the plurality of memory cells, the controller configured to:
retrieve data from a target row of memory cells of the plurality of memory cells associated with a read request received from a host using initial threshold voltages;
decode the data using a first hard decision decoding stage;
estimate a bit error rate (BER) of the target row of memory cells based on a distribution of threshold voltages of cells in a memory block containing the target row when the first hard decision decoding stage fails;
classify the BER of the target row based on a first BER threshold (BER-TH1); and
execute a first read flow comprising at least one hard decision decoding stage if the BER is less than the BER-TH1, and execute a second read flow similar to the first read flow if the BER is greater than or equal to the BER-TH1, the second read flow skipping a hard decision decoding stage of the first read flow.

* * * * *